(12) United States Patent
Tiwari et al.

(10) Patent No.: US 10,593,376 B2
(45) Date of Patent: *Mar. 17, 2020

(54) LONGEST ELEMENT LENGTH DETERMINATION IN MEMORY

(71) Applicant: Micron Technology, Inc., Boise, ID (US)

(72) Inventors: Sanjay Tiwari, Meridian, ID (US); Kyle B. Wheeler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/039,443

(22) Filed: Jul. 19, 2018

(65) Prior Publication Data

US 2018/0322911 A1 Nov. 8, 2018

Related U.S. Application Data

(63) Continuation of application No. 14/978,583, filed on Dec. 22, 2015, now Pat. No. 10,032,493.

(Continued)

(51) Int. Cl.
*G11C 7/10* (2006.01)
*G11C 7/06* (2006.01)
*G11C 11/4091* (2006.01)
*G11C 11/4096* (2006.01)
*G11C 19/28* (2006.01)

(52) U.S. Cl.
CPC ............ *G11C 7/1012* (2013.01); *G11C 7/065* (2013.01); *G11C 7/1006* (2013.01); *G11C 11/4091* (2013.01); *G11C 11/4096* (2013.01); *G11C 19/28* (2013.01); *G11C 2207/002* (2013.01); *G11C 2207/005* (2013.01); *G11C 2207/007* (2013.01)

(58) Field of Classification Search
CPC .............. G11C 7/1012; G11C 11/4096; G11C 11/4091; G11C 7/1006; G11C 7/065; G11C 2207/007; G11C 2207/005; G11C 2207/002; G11C 19/28
USPC .................................................... 365/189.05
See application file for complete search history.

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Warren Jr., Henry S., "Hacker's Delight", Second Edition, Oct. 2013, pp. 181-184 and 194.
(Continued)

*Primary Examiner* — Tha-O H Bui
(74) *Attorney, Agent, or Firm* — Brooks, Cameron & Huebsch, PLLC

(57) ABSTRACT

Apparatuses and methods determine a length of a longest element in a memory. An example method comprises determining, using a controller to control sensing circuitry, a length of a longest element of a plurality of variable length elements of a vector stored in a memory array.

20 Claims, 16 Drawing Sheets

Related U.S. Application Data

(60) Provisional application No. 62/100,752, filed on Jan. 7, 2015.

(56) References Cited

U.S. PATENT DOCUMENTS

| | | |
|---|---|---|
| 4,435,793 A | 3/1984 | Ochii |
| 4,617,641 A | 10/1986 | Hamada |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,363,009 B1 * | 3/2002 | Fukuzumi ............ G06F 12/0246 365/185.03 |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,719,893 B2 * | 5/2010 | Kim .................... G06F 11/1068 365/185.11 |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,130,557 B2 * | 3/2012 | Suda .................... G06F 12/0246 365/189.011 |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |

(56) References Cited

U.S. PATENT DOCUMENTS

| | | |
|---|---|---|
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0179733 A1* | 7/2012 | Nishimura .......... G06F 12/04 707/830 |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0089166 A1 | 3/2015 | Kogge |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |

(56) References Cited

FOREIGN PATENT DOCUMENTS

| KR | 10-2010-0134235 | 12/2010 |
|----|-----------------|---------|
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |
| WO | 2014137603 | 9/2014 |

OTHER PUBLICATIONS

Office Action for related Taiwan Patent Application No. 105100423, dated Jul. 7, 2017, 9 pages.
Office Action for related Taiwan Patent Application No. 105100423, dated Feb. 14, 2017, 11 pages.
International Search Report and Written Opinion for related PCT Application No. PCT/US2016/012412, dated May 10, 2016, (10 pgs.).
Boyd et al., "On the General Applicability of Instruction-Set Randomization", Jul.-Sep. 2010, (14 pgs.), vol. 7 Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).

* cited by examiner

| | COMP_COMP (431) | ITERATOR (433) | STATIC_MASK (435) | ELEMENT_MASK (437) | LONGEST (439) |
|---|---|---|---|---|---|
| 451-1 | | | | 0X8,8,8000,80 | 0 |
| 451-2 | | 0X8,8,8000,80 | 0X0 | 0X8,8,8000,80 | 0 |
| 451-3 | 0X7,7,7FFF,7F | 0X8,8,8000,80 | 0X0 | 0X8,8,8000,80 | 0 |
| 451-4 | 0XE,E,FFFE,FE | 0X8,8,8000,80 | 0X0 | 0X8,8,8000,80 | 0 |
| 451-5 | 0XE,E,FFFE,FE | 0X8,8,8000,80 | 0XE,E,FFFE,FE | 0X8,8,8000,80 | 0 |
| 451-6 | 0X8,8,8000,80 | 0X8,8,8000,80 | 0XE,E,FFFE,FE | 0X8,8,8000,80 | 0 |
| 451-7.a.1 | 0X8,8,8000,80 | 0X8,8,8000,80 | 0XE,E,FFFE,FE | 0X8,8,8000,80 | 0 |
| 451-7.b.1 | 0X8,8,8000,80 | 0X8,8,8000,80 | 0XE,E,FFFE,FE | 0X8,8,8000,80 | 0 |
| 451-7.c.1 | 0X4,4,4000,40 | 0X4,4,4000,40 | 0XE,E,FFFE,FE | 0X8,8,8000,80 | 1 |
| 451-7.a.2 | 0X4,4,4000,40 | 0X4,4,4000,40 | 0XE,E,FFFE,FE | 0X8,8,8000,80 | 1 |
| 451-7.b.2 | 0X4,4,4000,40 | 0X4,4,4000,40 | 0XE,E,FFFE,FE | 0X8,8,8000,80 | 1 |
| 451-7.c.2 | 0X2,2,2000,20 | 0X2,2,2000,20 | 0XE,E,FFFE,FE | 0X8,8,8000,80 | 2 |
| 451-7.a.3 | 0X2,2,2000,20 | 0X2,2,2000,20 | 0XE,E,FFFE,FE | 0X8,8,8000,80 | 2 |
| 451-7.b.3 | 0X2,2,2000,20 | 0X2,2,2000,20 | 0XE,E,FFFE,FE | 0X8,8,8000,80 | 2 |
| 451-7.c.3 | 0X1,1,1000,10 | 0X1,1,1000,10 | 0XE,E,FFFE,FE | 0X8,8,8000,80 | 3 |
| 451-7.a.4 | 0X1,1,1000,10 | 0X1,1,1000,10 | 0XE,E,FFFE,FE | 0X8,8,8000,80 | 3 |
| 451-7.b.4 | 0X1,1,1000,10 | 0X1,1,1000,10 | 0XE,E,FFFE,FE | 0X8,8,8000,80 | 3 |
| 451-7.c.4 | 0X0,0,0800,08 | 0X0,0,0800,08 | 0XE,E,FFFE,FE | 0X8,8,8000,80 | 4 |
| 451-7.a.5 | 0X0,0,0800,08 | 0X0,0,0800,08 | 0XE,E,FFFE,FE | 0X8,8,8000,80 | 4 |
| 451-7.b.5 | 0X0,0,0800,08 | 0X0,0,0800,08 | 0XE,E,FFFE,FE | 0X8,8,8000,80 | 4 |
| 451-7.c.5 | 0X0,0,0400,04 | 0X0,0,0400,04 | 0XE,E,FFFE,FE | 0X8,8,8000,80 | 5 |
| 451-7.c.6 | 0X0,0,0200,02 | 0X0,0,0200,02 | 0XE,E,FFFE,FE | 0X8,8,8000,80 | 6 |
| 451-7.c.7 | 0X0,0,0100,01 | 0X0,0,0100,01 | 0XE,E,FFFE,FE | 0X8,8,8000,80 | 7 |
| 451-7.c.8 | 0X0,0,0080,00 | 0X0,0,0080,00 | 0XE,E,FFFE,FE | 0X8,8,8000,80 | 8 |
| 451-7.c.9 | 0X0,0,0040,00 | 0X0,0,0040,00 | 0XE,E,FFFE,FE | 0X8,8,8000,80 | 9 |
| 451-7.c.10 | 0X0,0,0020,00 | 0X0,0,0020,00 | 0XE,E,FFFE,FE | 0X8,8,8000,80 | 10 |
| 451-7.c.11 | 0X0,0,0010,00 | 0X0,0,0010,00 | 0XE,E,FFFE,FE | 0X8,8,8000,80 | 11 |
| 451-7.c.12 | 0X0,0,0008,00 | 0X0,0,0008,00 | 0XE,E,FFFE,FE | 0X8,8,8000,80 | 12 |
| 451-7.c.13 | 0X0,0,0004,00 | 0X0,0,0004,00 | 0XE,E,FFFE,FE | 0X8,8,8000,80 | 13 |
| 451-7.c.14 | 0X0,0,0002,00 | 0X0,0,0002,00 | 0XE,E,FFFE,FE | 0X8,8,8000,80 | 14 |
| 451-7.c.15 | 0X0,0,0001,00 | 0X0,0,0001,00 | 0XE,E,FFFE,FE | 0X8,8,8000,80 | 15 |
| 451-7.c.16 | 0X0,0,0000,00 | 0X0,0,0000,00 | 0XE,E,FFFE,FE | 0X8,8,8000,80 | 16 |

*Fig. 4A*

|  | CARRY (462) | A (464) | B (466) | C (468) |
|---|---|---|---|---|
| 453-0 | 0000 | 0010 | 0001 | 0000 |
| 453-1.2 | 0000 | 0010 | 0001 | 0001 |
| 453-1.1a | 0000 | 0010 | 0001 | 0001 |
| 453-1.2 | 0000 | 0010 | 0001 | 0011 |
| 453-1.2a | 0000 | 0010 | 0001 | 0011 |
| 453-1.3 | 0000 | 0010 | 0001 | 0011 |
| 453-1.3a | 0000 | 0010 | 0001 | 0011 |
| 453-1.4 | 0000 | 0010 | 0001 | 0011 |
| 453-1.4a | 0000 | 0010 | 0001 | 0011 |

*Fig. 4B*

TABLE 8-1

| | | 844 | 845 | 856 | 870 | 871 |
|---|---|---|---|---|---|---|
| | | A | B | NOT OPEN | OPEN TRUE | OPEN INVERT |
| | | 0 | 0 | 0 | 0 | 1 |
| | | 0 | 1 | 0 | 1 | 0 |
| 875 → | | 1 | 0 | 1 | 0 | 1 |
| | | 1 | 1 | 1 | 1 | 0 |

TABLE 8-2

| | | A | B | A | A*B | A*B̄ | A+B | B | AXB | A+B̄ | ĀXB | B̄ | |
|---|---|---|---|---|---|---|---|---|---|---|---|---|---|
| | FF | | | 0 | 0 | 0 | 0 | 0 | 0 | 1 | 1 | 1 | ← 876 |
| | FT | | | 0 | 0 | 0 | 1 | 1 | 1 | 0 | 0 | 0 | ← 877 |
| | TF | | | 0 | 0 | 1 | 0 | 0 | 1 | 0 | 0 | 1 | ← 878 |
| | TT | | | 0 | 1 | 0 | 0 | 1 | 0 | 0 | 1 | 0 | ← 879 |
| | | A | B | A | A*B | A*B̄ | A+B | B | AXB | A+B̄ | ĀXB | B̄ | ← 847 |
| | | 0 | 0 | 0 | 0 | 0 | 0 | 0 | 0 | 1 | 1 | 1 | |
| | | 0 | 1 | 0 | 0 | 0 | 1 | 1 | 1 | 0 | 0 | 0 | |
| | | 1 | 0 | 1 | 0 | 1 | 1 | 0 | 1 | 1 | 0 | 1 | |
| | | 1 | 1 | 1 | 1 | 0 | 1 | 1 | 0 | 1 | 1 | 0 | |

*Fig. 8*

LONGEST ELEMENT LENGTH DETERMINATION IN MEMORY

PRIORITY INFORMATION

This application is a Continuation of U.S. application Ser. No. 14/978,583, filed Dec. 22, 2015, which issues as U.S. Pat. No. 10,032,493 on Jul. 24, 2018, which claims the benefit of U.S. Provisional Application No. 62/100,752, filed Jan. 7, 2015, the contents of which are included by reference.

TECHNICAL FIELD

The present disclosure relates generally to semiconductor memory apparatuses and methods, and more particularly, to apparatuses and methods related to determining a length of a longest element in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array to execute instructions). Data can be moved from the memory array to registers external to the memory array via a bus.

BRIEF DESCRIPTION OF THE DRAWINGS

FIGS. 4A-B illustrate a table showing the states of memory cells of an array at a particular phase associated with determining a length of a longest element in accordance with a number of embodiments of the present disclosure.

FIG. 8 is a logic table illustrating selectable logic operation results implemented by a sensing circuitry in accordance with a number of embodiments of the present disclosure.

DETAILED DESCRIPTION

Figure 1:
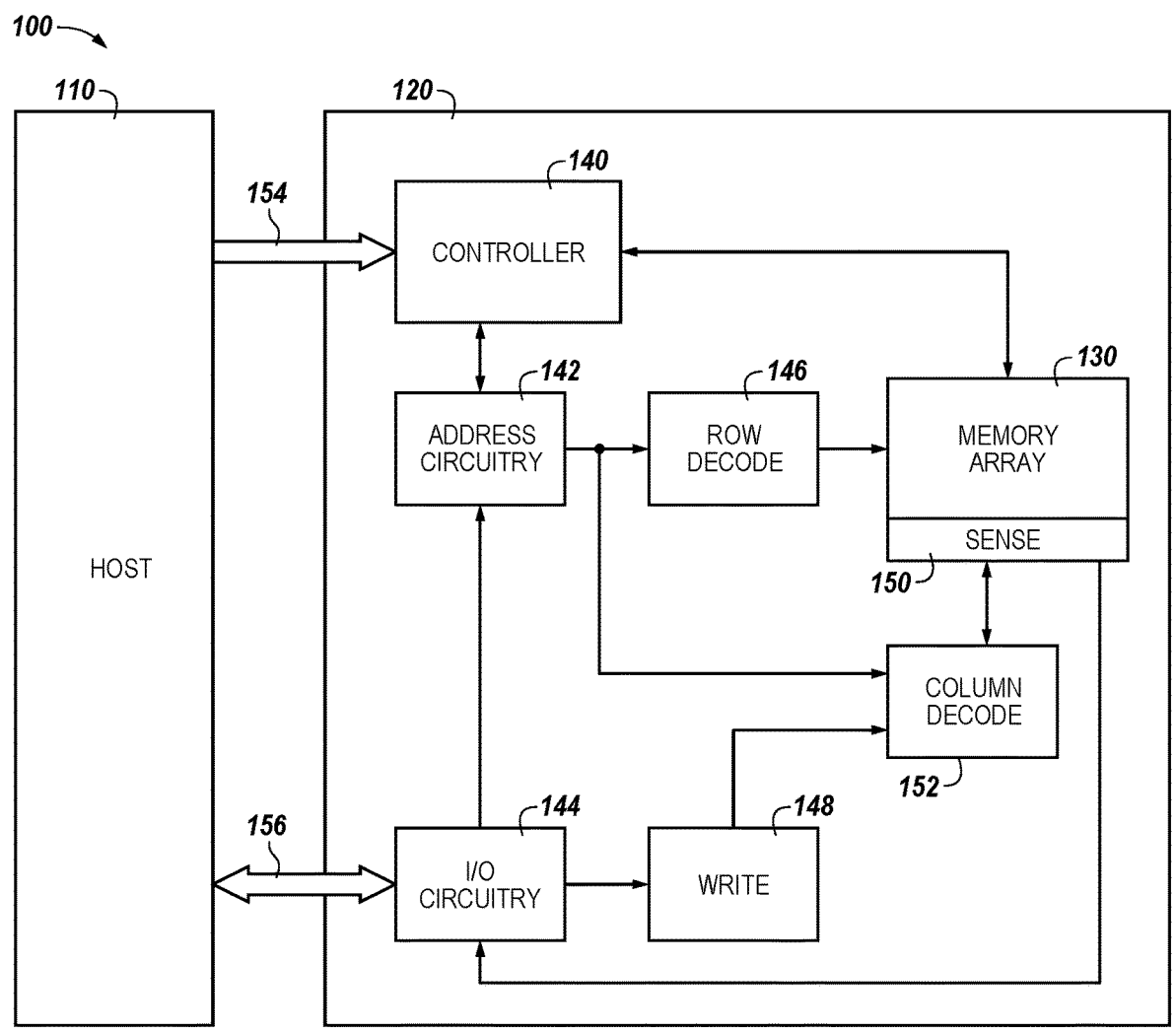
FIG. 1 is a block diagram of an apparatus in the form of a computing system including a memory device in accordance with a number of embodiments of the present disclosure.

The present disclosure includes apparatuses and methods related to determining a length of a longest element in memory. A determination of a length of a longest element can be performed in memory. For example, a determination of a length of a longest element can include determining which element of a number of variable length elements is the longest element. That is, a determination of which element includes the greatest number of data values (e.g., bits). The determination of the length of the longest element can include performing a number of AND operations, shift operations, and invert operations without transferring data via an input/output (I/O) line, for example. The determination of the length of the longest element can include performing an operation (e.g., a BlockOR operation) to determine whether at least one bit of a vector (including a number of elements) includes a particular data value (e.g., a bit value of 1)

In a number of examples, an element can represent an object and/or other construct, which may be stored in memory as a bit-vector. As an example, a number of bits can be stored in memory cells coupled to a particular access line (e.g., a row) of a memory array as a vector. The vector can comprise a number of elements which may have variable (e.g., different) lengths. For example, at least two elements of a vector can have differing lengths (e.g., different numbers of bits).

A number of embodiments of the present disclosure can provide a reduction of the number of computations and/or time involved in performing a determination of the length of the longest element of a plurality of variable length elements relative to previous approaches. For instance, the number of computations and/or the time to perform a determination of a length of the longest element can be reduced by performing operations in memory in parallel (e.g., simultaneously). Performing a determination of a length of a longest element as described herein can also reduce power consumption as compared to previous approaches. In accordance with a number of embodiments, a determination of a length of a longest element can be performed on elements (e.g., data in the form of bit-vectors including elements of variable length stored in an array) without transferring data out of the memory array and/or sensing circuitry via a bus (e.g., data bus, address bus, control bus, etc.). A determination of a length of a longest element can involve performing a number of operations (e.g., AND operations, OR operations, shift operations, invert operations, and BlockOR operations, etc.). However, embodiments are not limited to these examples.

In various previous approaches, variable length elements may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with determining a length of a longest element, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 120 in accordance with a number of embodiments of the present disclosure. As used herein, a memory device 120, a memory array 130, controller 140, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 3.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The controller 140 can be a state machine, a sequencer, or some other type of controller. While FIG. 1 illustrates arrows indicating communication between controller 140 and address circuitry 142 and memory array 130, embodiments are no so limited. Controller 140 can provide signals to operate a number of elements in memory device 120 including I/O circuitry 144, row decode 146, write circuitry 148, memory array 130, sense circuitry 150, and column decode circuitry 152.

An example of the sensing circuitry 150 is described further below in association with FIGS. 2A and 2B. For instance, in a number of embodiments, the sensing circuitry 150 can comprise a number of sense amplifiers and a number of compute components, which may comprise a latch serving as an accumulator and can be used to perform logical operations (e.g., on data associated with complementary sense lines). In a number of embodiments, the sensing circuitry (e.g., 150) can be used to determine a length of a longest element using data stored in array 130 as inputs and store the results of the longest element length determination back to the array 130 without transferring via a sense line address access (e.g., without firing a column decode signal). As such, a determination of a longest element length can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)).

In various previous approaches, data associated with a determination of a length of an element, for instance, would be read from memory via sensing circuitry and provided to an external ALU (e.g., via a bus). The external ALU circuitry would be used to perform the longest element length determination using the elements (which may be referred to as operands or inputs) and the result could be transferred back to the array via the local I/O lines. In contrast, in a number of embodiments of the present disclosure, sensing circuitry (e.g., 150) is configured to perform a determination of a length of a longest element on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the longest element length determination as the sensing circuitry 150 can be operated to perform the appropriate operations involved in performing the longest element length determination using the address space of memory array 130. Additionally, the determination of the longest element length can be performed without the use of an external processing resource.

Figure 2A:
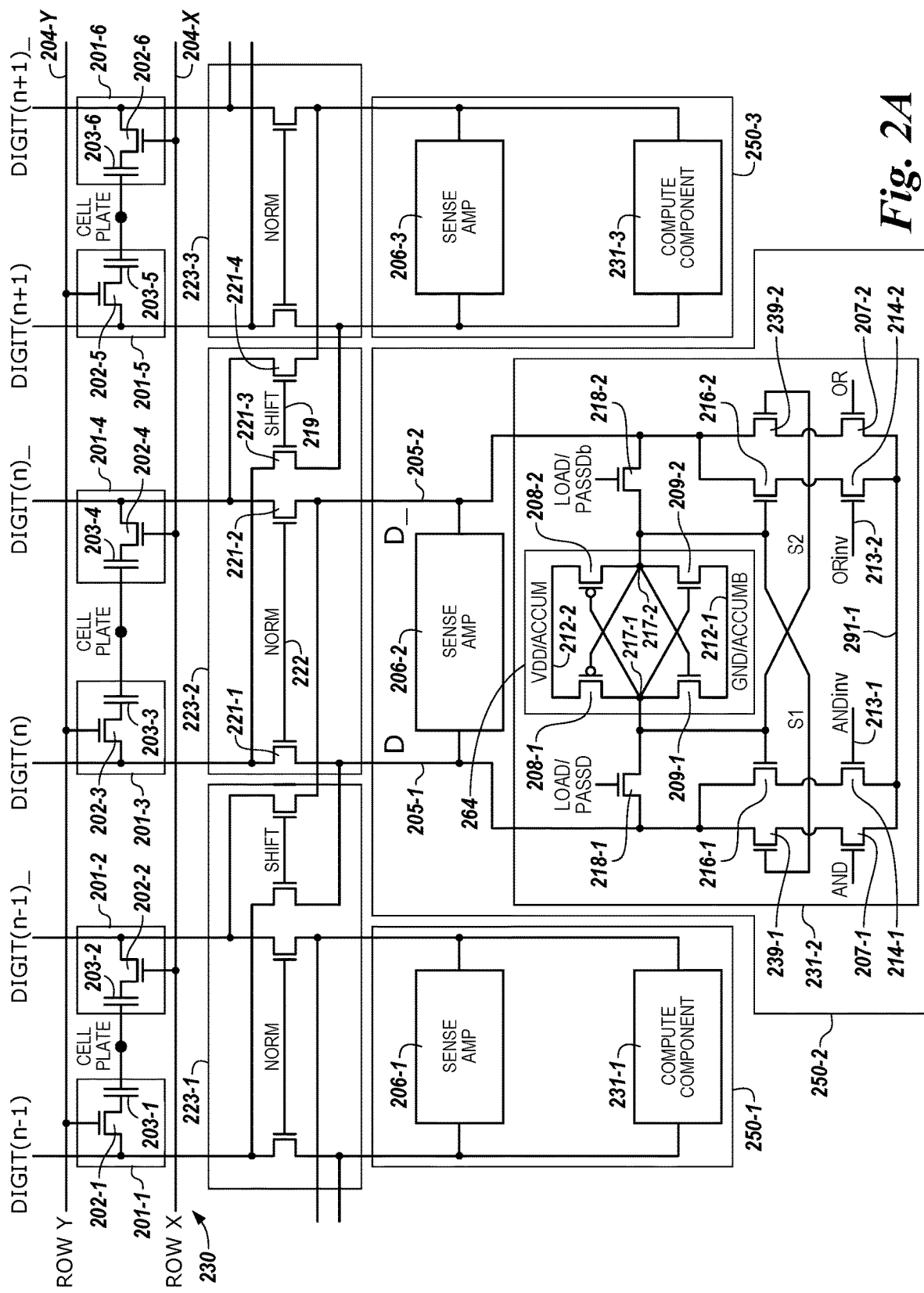
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell comprises a storage element (e.g., capacitor) and an access device (e.g., transistor). For instance, memory cell 201-1 comprises transistor 202-1 and capacitor 203-1 memory cell 201-2 comprises transistor 202-2 and capacitor 203-2, memory cell 201-3 comprises transistor 202-3 and capacitor 203-3, and memory cell 201-4 comprises transistor 202-4 and capacitor 203-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-Y. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-X. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry 250-1, 250-2, 250-3, etc., in accordance with a number of embodiments of the present disclosure. Sensing circuitry comprises a sense amplifier and a compute component corresponding to respective columns of memory cells (e.g., coupled to respective pairs of complementary data lines). In this example, the sensing circuitry 250-1 comprises a sense amplifier 206-1 and a compute component 231-1 corresponding to respective columns of memory cells (e.g., memory cells 201-1 and 201-2 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B.

In the example illustrated in FIG. 2A, the circuitry corresponding to compute component 231-2 comprises a static latch 264 and an additional ten transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch of the compute component 231-2 can be collectively referred to herein as a secondary latch, which can serve as an accumulator. As such, the compute component 231-2 can operate as and/or be referred to herein as an accumulator. The compute component 231-2 can be coupled to each of the data lines D 205-1 and D_ 205-2 as shown in FIG. 2A. However, embodiments are not limited to this example. The transistors of compute component 231-2 can all be n-channel transistors (e.g., NMOS transistors), for example.

In this example, data line D 205-1 can be coupled to a first source/drain region of transistors 216-1 and 239-1, as well as to a first source/drain region of load/pass transistor 218-1. Data line D_ 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ANDinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 2A is not contingent on the LOAD control signal being elevated to a voltage greater than $V_{DD}$.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231-2, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines D 205-1 and D_ 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
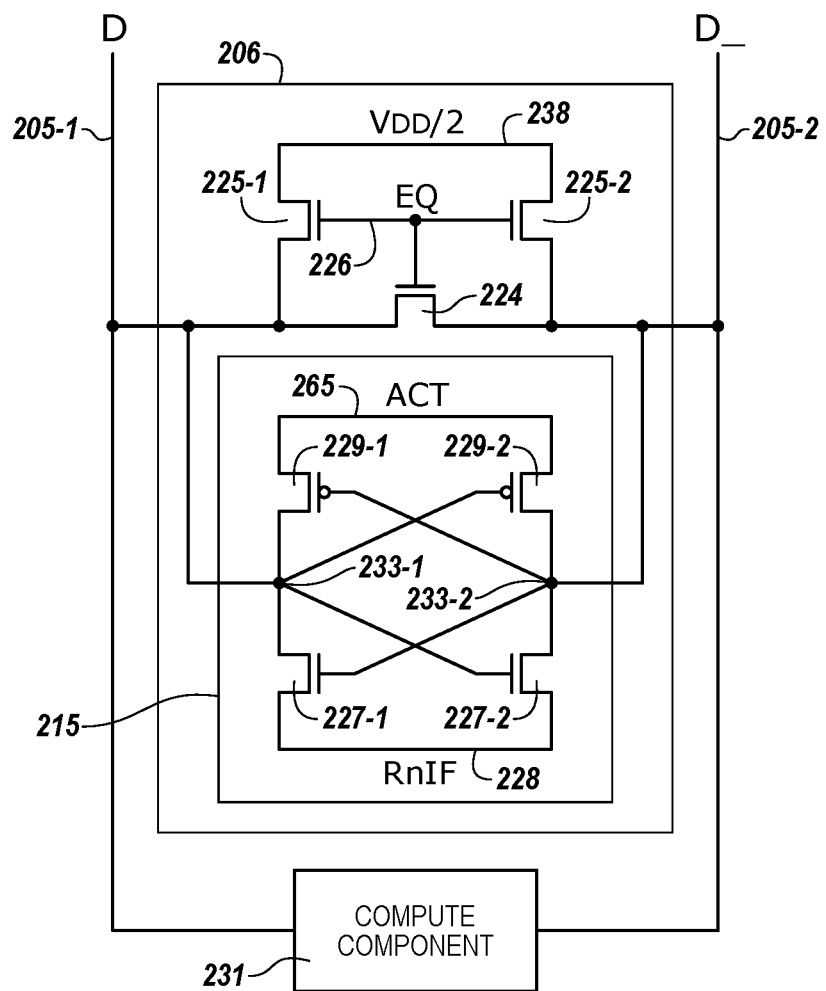
FIG. 2B is a schematic diagram illustrating a portion of sensing circuitry in accordance with a number of embodiments of the present disclosure.

In this example, a second source/drain region of transistor 209-1 and 209-2 is commonly coupled to a negative control signal line 1312-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In this example, the shift circuitry 223-2 comprises a pair of isolation devices (e.g., isolation transistors 221-1 and 221-2) coupled to data lines 205-1 (D) and 205-2 (D_), respectively. The isolation transistors 221-1 and 221-2 are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_)). According to various embodiments, conduction of isolation transistors 221-1 and 221-2 can be referred to as a "normal" configuration of the shift circuitry 223-2.

In the example illustrated in FIG. 2A, the shift circuitry 223-2 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206-2 and compute component 231-2 are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223-2 can be arranged as a portion of (e.g., within) the sense amplifier 206-2, for instance.

Although the shift circuitry 223-2 shown in FIG. 2A includes isolation transistors 221-1 and 221-2 used to couple particular sensing circuitry 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250-2 to an adjacent pair of complementary data lines in one particular direction (e.g., adjacent data lines DIGIT(n+1) and DIGIT(n+1) shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT (n−1) _shown to the left in FIG. 2A). Shift circuitry 223-1 can include isolation transistors used to couple particular sensing circuitry 250-1 to a particular pair of complementary data lines (e.g., DIGIT(n−1) and DIGIT(n−1)_) and isolation transistors arranged to couple the particular sensing circuitry 250-1 to an adjacent pair of complementary data lines in one particular direction (e.g., adjacent data lines DIGIT(n) and DIGIT(n)_ shown in FIG. 2A). Shift circuitry 223-3 can include isolation transistors used to couple particular 250-3 to a particular pair of complementary data lines (e.g., DIGIT(n+1) and DIGIT(n+1)_) and isolation transistors arranged to couple the particular sensing circuitry 250-3 to an adjacent pair of complementary data lines in one particular direction (e.g., adjacent data lines DIGIT (n) and DIGIT(n)_ to the left and DIGIT(n+2) and DIGIT(n+2)_ to the right (not shown)).

Embodiments of the present disclosure are not limited to the configuration of shift circuitry 223-2 shown in FIG. 2A. That is, determining whether to shift in a particular direction to perform a shift operation is independent of the circuitry implementation. In a number of embodiments, shift circuitry 223-2 such as that shown in FIG. 2A can be operated (e.g., in conjunction with sense amplifiers 206-2 and compute components 231-2) in association with performing mathematical operations such as adding and subtracting operations without transferring data out of the sensing circuitry 250 via an I/O line (e.g., local I/O line (IO/IO_)), for instance.

Although not shown in FIG. 2A, each column of memory cells can be coupled to a column decode line that can be activated to transfer, via local I/O line, a data value from a corresponding sense amplifier 206-2 and/or compute component 231-2 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 223-2 can be operated in conjunction with sense amplifiers 206-2 and compute components 231-2 to perform without transferring data to a control component external to the array, for instance.

FIG. 2B is a schematic diagram illustrating a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231-2 and/or the memory cells of an array (e.g., 230 shown in FIG. 2A) to which they are coupled, which may conform to a particular feature size (e.g., $4F^2$, $6F^2$, etc.). The sense amplifier 206 comprises a latch 215 including four transistors coupled to a pair of complementary data lines D 205-1 and D_ 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231-2, which may be referred to herein as an accumulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 290 (ACT). The ACT signal 290 can be a supply voltage (e.g., $V_{DD}$) and the RnIF signal can be a reference voltage (e.g., ground). Activating signals 228 and 290 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$ where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206 and compute component 231-2, and the result can be stored in the sense amplifier and/or compute component.

The sensing circuitry 250 can be operated in several modes to perform logical operations, including a first mode in which a result of the logical operation is initially stored in the sense amplifier 206, and a second mode in which a result of the logical operation is initially stored in the compute component 231-2. Additionally with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231-2, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing various operations (e.g., logical operations, mathematical operations, etc.) using less power than various previous approaches. Additionally, since a number of embodiments eliminate the need to transfer data across I/O lines in order to perform operations (e.g., between memory and discrete processor), a number of embodiments can enable an increased parallel processing capability as compared to previous approaches.

Figure 3:
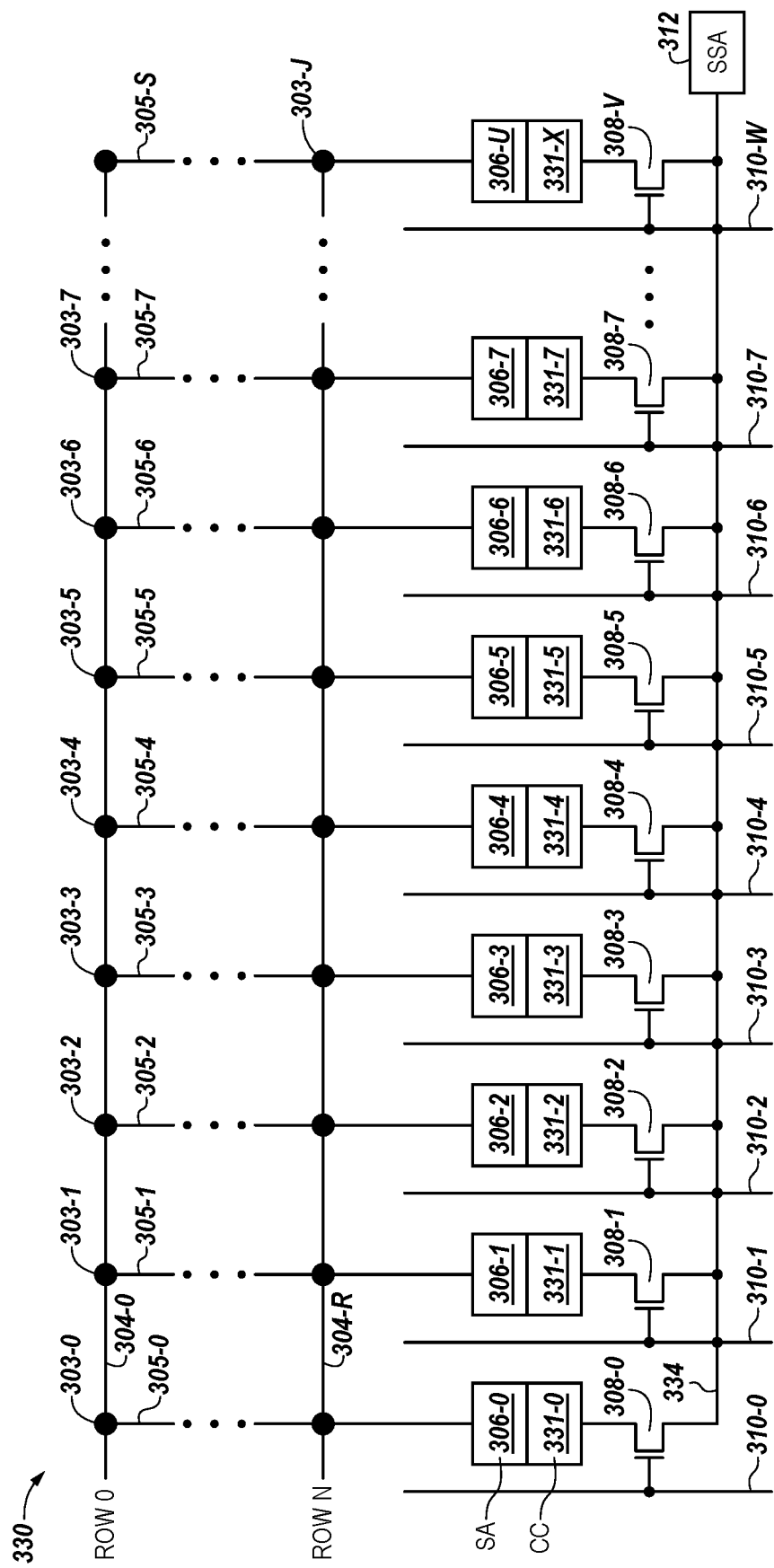
FIG. 3 illustrates a schematic diagram of a portion of a memory array in accordance with a number of embodiments of the present disclosure.

FIG. 3 illustrates a schematic diagram of a portion of a memory array 301 in accordance with a number of embodiments of the present disclosure. The array 301 includes memory cells 303-0 to 303-J (referred to generally as memory cells 303) coupled to rows of access lines 304-0, . . . , 304-R and columns of sense lines 305-0, 305-1, 305-2, 305-3, 305-4, 305-5, 305-6, 305-7, . . . , 305-S. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, ..., 306-U (refereed generally as sense amplifiers 306) coupled to the respective sense lines 305-0, 305-1, 305-2, 305-3, 305-4, 305-5, 305-6, 305-7, ..., 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, ..., 308-V. In this example, the sensing circuitry also comprises a number of compute components 331-0, 331-1, 331-2, 331-3, 331-4, 331-5, 331-6, 331-7, ..., 331-X (referred to generally as compute components 331) coupled to the respective sense lines. Column decode lines 310-1 to 310-W are coupled to the gates of transistors 308-1 to 308-V, respectively, and can be selectively activated to transfer data sensed by respective sense amps 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

The memory cells 303 can stored a number of bit-vectors. For example, cells 303-0 to 303-31 can store a 32-bit bit-vector. An example 32-bit bit-vector can include bit-vector [0101, 1100, 0001 0000 1000 0001, 0101 0000]. The notation of commas in the provided example bit-vector indicates a separation of elements in the bit-vector. For example, the first and second element are each four (4) bits in length, the third element is sixteen (16) bits in length, and the fourth element is eight (8) bits in length, wherein each element is separated by a comma. The example 32-bit source bit-vector includes 4 elements. The first element [0101] can be stored in cells 303-0 to 303-3 and represent a numerical base ten (10) value of 5. The second element [1100] can be stored in cells 303-4 to 303-7 and represent a numerical base ten (10) value of 12. The third element can be stored in cells 303-8 to 303-23 and represent a numerical base ten (10) value of 4,225. The fourth element can be stored in cells 303-24 to 303-31 and represent a base ten (10) numerical value of 80. However, embodiments are not so limited. The example 32-bit bit-vector is provided as an example for illustrative purposes and bit-vectors are not limited to such values.

In a number of embodiments, the sensing circuitry (e.g., compute components 331 and sense amplifiers 306) is configured to perform a determination of a length of a longest element of a number of elements stored in array 301. As an example, a first element of a plurality of variable length elements can be stored in a first group of memory cells (e.g., cells 303-0 to 303-3) coupled to a particular access line (e.g., 304-0) and to a first number of sense lines (e.g., 305-0 to 305-3), a second element of the plurality of variable length elements can be stored in a second group of memory cells (e.g., cells 303-4 to 303-7) coupled to the access line (e.g., 304-0) and a second number of sense lines (e.g., 305-4 to 305-7), a third element of the plurality of variable length elements can be stored in a third group of cells (e.g., cells 303-8 to 303-23) coupled to the access line (e.g., 304-0) and a third number of sense lines (e.g., 305-8 to 305-23), and a fourth element of the plurality of variable length elements can be stored in a fourth group of memory cells (e.g., cells 303-24 to 303-31) coupled to the access line (e.g., 304-0) and a fourth number of sense lines (e.g., 305-24 to 305-31). While the example illustrates a particular length for each of the elements (e.g., first element with length of 4 bits, second element with length of 4 bits, third element with length of 16 bits, and fourth element with length of 8 bits), embodiments are not so limited. Variable length elements refers to a number of elements within a bit-vector that are of varying lengths. For example, a first and second element of a bit-vector can be a different length than a third element and the first, second, and third elements of a bit-vector can be a different length than a fourth element.

An example determination of a length of a longest element is described below in association with FIG. 4A, which illustrates tables showing the states of memory cells of an array (e.g., 330) at a number of particular phases associated with determining a length of a longest element of a plurality of variable length elements in accordance with a number of embodiments described herein. The reference numbers of the rows of the tables shown in FIG. 4A correspond to respective reference numbers of the pseudo code described below (e.g., row 451-1 corresponds to reference number 1 of the pseudo code, row 451-2 corresponds to reference number 2 of the pseudo code, etc.). Each row of the tables indicates the values of a number of bit vectors 431 (Comp_Comp), 433 (Iterator), 435 (Static_Mask), 437 (Elem_Mask), and 439 (Longest) at a particular phase of determining a length of a longest element.

The example described in association with FIG. 4A is associated with determining a length of a longest element of four elements of a bit-vector stored in a group of memory cells coupled to a particular access line and to a number of sense lines. In the example described in association with FIG. 4A, the bit-vector comprises 32 bits, is stored in memory cells coupled to access line 304-0 and to sense lines 305-0 to 305-31, and comprises four elements. The example bit-vector provided above (e.g., bit-vector [0101, 1100, 0001 0000 1000 0001, 0101 0000]) can be used to perform a number of calculations. For example, at least one of a multiplication, division, addition, and/or subtraction operation can be performed on the elements of the example 32-bit bit-vector. To perform at least one of the operations, a length of a longest element of the bit-vector can reduce the number of sub-operations to be performed in order to perform the mathematical operation. For example, the third element of the example bit-vector (e.g., element [0001 0000 1000 0001]) is the longest element. Determining that the longest element is 16 bits in length can reduce the number of sub-operations to be performed on the bit-vector. In order to determine a length of the longest element of a bit-vector, an element mask can be provided that indicates a most significant bit of each element of the bit-vector. For example, the element mask for the example 32-bit bit-vector is [1000, 1000, 1000 0000 0000 0000, 1000 0000]. The element mask can be provided or determined by performing a number of operations to determine the most significant bit of each element of a bit-vector. The element mask can be used to determine a length of a longest element of a bit-vector.

The element mask in the example described in FIG. 4A is represented in binary notation as [1000 1000 1000 0000 0000 0000 10000 0000], which can be represented as [0x8,8,8000,80] in hexadecimal notation, where the commas indicate a boundary between elements. The bit-vectors (e.g., 431, 433, 435, 437) shown in FIG. 4A are illustrated in hexadecimal notation (e.g., as indicated by the preceding "0x"). The element mask is represented in hexadecimal notation as [8,8,8000,80] and is shown in FIG. 4A as "0x8,8,8000,80"). The first element of the element mask (e.g., the first element of the element mask corresponding to a first element of a plurality of variable length elements) comprises 4 bits and is illustrated as "8" (e.g., bolded bit

[0x88800080]), the second element of the element mask bit-vector is illustrated as "8" (e.g., [0x88800080]), the third element of the element mask bit-vector is illustrated as "8000" (e.g., [0x88800080]), and the fourth element of the element mask bit-vector is illustrated as "80" (e.g., [0x88800080]). While in this example the bit-vector represents a most-significant bit of each element of the element mask bit-vector (e.g., corresponding to a plurality of variable length elements), embodiments are not so limited. The most-significant bit-vector (e.g., referred to as an element mask and designated by Elem-mask 437 in FIG. 4A) is used for ease of reference of the most-significant bit of each element for determining a length of the longest element.

In this example, the bit-vectors Iterator 433, Static_Mask 435, and Elem_Mask 437 have a length of 32 bits. In this example, the four elements represented by the Elem_Mask 437 each have a variable length. For instance, the first and second elements are represented by respective 4-bit vectors (e.g., the first and second elements comprise 4 bits), the third element is represented by a 16 bit vector (e.g., the third element comprises 16 bits), and the fourth element is represented by a respective 8-bit vector (e.g., the fourth element comprises 8 bits). It is noted that although hexadecimal notation is used in FIG. 4A, the bit-vectors are stored as binary data patterns in the array during the longest element length determination. Also, in the examples described herein, commas and/or spaces may be used to separate individual elements within a bit-vector. For instance, in the example above, the Elem_Mask bit-vector 437 comprises four elements which are sometimes separated by spaces to designate a differing element. Embodiments are not limited to a particular element size (e.g., to a particular number of elements and/or bits per element). The result of the longest element length determination can be stored in an array (e.g., stored in cells coupled to access line 304-R in array 330) and/or can be transferred external to the array (e.g., to functional unit circuitry of a host).

The expected result of determining a longest element length of the Elem_Mask bit-vector 437 (e.g., [0x88800080]) is 16 since the third element includes 16 bits. As described further below, the result of a determination of a longest element length can be stored as a bit-vector and/or a data value in a particular group of memory cells (e.g., as Longest bit-vector 439 and/or a data value indicating 16). For instance, in the example of FIG. 4A, the memory cells corresponding to Longest 439 are used to store the result of the longest element length determination (as illustrated by "16" being stored as the Longest bit-vector 439 at row 451-7.c.16).

As described further below, the bit vectors 433 (Iterator), 435 (Static_Mask), and 437 (Elem_mark) can be used in association with determining a longest element length of a source bit-vector (e.g., the 32-bit example bit-vector including a plurality of variable length elements). The bit-vectors 433, 435, 437, and 439 can be stored in respective groups of memory cells coupled to particular access lines, which may be referred to as temporary storage rows (e.g., rows storing data that may be updated during various phases of a longest element length determination).

In the example described in association with FIG. 4A, the first element of the Elem_Mask bit-vector 437 (e.g., the first [8] of bit-vector [0x88800080]) can be stored (e.g., as a four bit bit-vector [1000]) in memory cells 303-0 to 303-3, the second element (e.g., the second 8 of bit-vector [0x88800080]) can be stored (e.g., as a four bit bit-vector [1000]) in cells 303-4 to 303-7, the third element (e.g., [8000] of bit-vector '0x88800080]) can be stored (e.g., as a 16 bit bit-vector [1000 0000 0000 0000]) in cells 303-8 to 303-23, and the fourth element (e.g., [80] of bit-vector [0x88800080]) can be stored (e.g., as an eight bit bit-vector [1000 0000]) in memory cells 303-24 to 303-31.

In a number of examples, a determination of a longest element length includes performing a number of AND operations, shift operations, invert operations, and BlockOR operations. The determination includes performing the AND operations, shift operations, and invert operations without transferring data via an input/output (I/O) line to determine a longest element length. The number of AND operations, invert operations, and shift operations can be performed using sensing circuitry on pitch with each of a number of columns of complementary sense lines.

The below pseudo code (e.g., Psuedocode A and Pseudo code B) represents instructions executable to perform a number of operations to determine a longest element length in a memory in accordance with a number of embodiments of the present disclosure. The example pseudo code is referenced using reference numbers 1-7, which correspond to the reference numbers of the rows shown in the tables of FIG. 4A. For instance, reference number 1 (e.g., "Receive elemental mask and store as Elem_Mask") corresponds to row 451-1, reference number 2 (e.g., "Obtain Temp Row Iterator") corresponds to row 451-2, and reference number 7.a (e.g., "Perform BlockOR") corresponds to rows 451-7.a.1, as illustrated in FIG. 4A. Note that Pseudo code I does not use the Iterator 437 column as the Iterator is used in Pseudo code II when operations performed based on a length of the longest element are performed alongside the determination of the length of the longest element (e.g., after each iteration and/or loop to determine an additional bit position to add to the length calculation, an operation is performed).

---
Pseudo code I
---
1. Receive elemental mask and store as Elem_Mask;
2. Obtain Temp Rows;
3. Load Elem_Mask in Comp_Comp and Invert;
4. Shift Left;
5. Store as Static-Mask;
6. Load Elem_Mask in Comp_Comp;
7. Loop until BlockOR terminates;
    7.a Perform BlockOR;
    7.b Shift Comp_Comp Right;
    7.c Perform AND with Static_Mask and Add 1 to Longest;

---
Pseudo code II (for Performing Operations concurrent with Determination of a Longest Element length)
---
1. Receive elemental mask and store as Elem_Mask;
2. Obtain Temp Rows;
3. Load Elem_Mask in Comp_Comp and Invert;
4. Shift Left;
5. Store as Static-Mask;
6. Load Elem_Mask in Comp_Comp;
7. Loop until BlockOR terminates;
    7.a Perform BlockOR and loop of operation;
    7.b Load Iterator into Comp_Comp, Shift Comp_Comp Right;
    7.c Perform AND with Static_Mask, Add 1 to Longest, and Store Comp_Comp in Iterator;

For purposes of discussion, the above pseudo code will be divided into a setup phase and a determination phase associated with determining a longest element length. The pseudo code referenced by reference numbers 1-6 can correspond to the setup phase. In the example illustrated in FIG. 4A, a bit-vector value illustrated in bold indicates a change in the value of the bit-vector (e.g., the value of the bit-vector stored in the memory cells corresponding to Iterator 433 is shown in bold in FIG. 4A to indicate a change from [0x88800080] as shown in row 451-7.*b*.1 to [0x44400040] as shown in row 451-7.*c*.1). FIG. 4A illustrates the values of a number of bit-vectors associated with performing the setup phase of a longest element length determination. The pseudo code referenced by reference number 7 (e.g., 7.*a*-7.*c*) can correspond to the determination phase.

Rows 451-1 to 451-6 of the table in FIG. 4A correspond to instructions referenced by respective reference numbers 1 to 6 in Pseudo code I above. As such, rows 451-1 to 451-6 indicate values of the bit vectors 435 and 437 during execution of the setup phase as described by the above pseudo code. Reference number 1 (e.g., "Receive elemental mask and store as Elem_Mask") of the above pseudo code is associated with receiving an elemental mask (e.g., [0x88800080]) and storing the elemental mask as the Elem_Mask bit-vector 437. The Elem_Mask 437 indicates a most significant bit of each of the elements of the plurality of variable length elements. As an example, a bit pattern (e.g., the element mask referred to as Elem_Mask 437 in FIG. 4A) comprising a "1" in a MSB position and all "0s" in the remaining bit positions can be used to indicate the MSBs of the constituent elements of a source bit-vectors (e.g., example 32-bit bit-vector described above). As shown in row 451-1 of FIG. 4A, in this example, Elem_Mask 437 a 32-bit hexadecimal bit-vector [88800080] (e.g., binary [1000, 1000, 1000000000000000, 10000000]). The vector indicating a most significant bit for each element of the plurality of variable length elements can be received from an external host and/or a number of sources. However, embodiments are not so limited, as the most significant bit vector can be obtained be performing a number of operations appreciated by those skilled in the art.

Reference number 2 (e.g., "Obtain Temp Rows") of the above pseudo code is associated with initializing a number of groups of memory cells for use as temporary storage rows. Initializing refers to designating and/or assigning particular access lines used to store particular bit-vectors for performing the longest element length determination. That is, the number of groups of memory cells can be initialized and/or designated groups of cells coupled to respective access lines (e.g., rows) that store data (e.g., on a temporary basis) in association with performing the longest element length determination. For example, a first group of memory cells can be coupled to a particular access line (e.g., 304-R, illustrated as ROW N) and can store a bit-vector referred to as a "Static_Mask" bit-vector 435. A second group of memory cells can be coupled to another access line (e.g., an additional access line also designated by 304-R but in addition to the initialized row for the Static_mask bit-vector above) and can store a bit-vector referred to as a "Iterator" bit-vector 433 (note that the Iterator is initialized for the second set of pseudo code, Pseudo code II, when performing operations dependent on the length of the longest element concurrent with determining a length of the longest element). Embodiments are not limited to a particular number of temporary storage rows and/or to storage of the corresponding bit-vectors on particular access lines. Also, although the groups of memory cells used to store bit-vectors 433, 435, 437 may be referred to as "rows," the respective groups of memory cells may comprise fewer than all of the cells coupled to a particular access line. Furthermore, in a number of embodiments, temporary storage rows can refer to access lines which may not be addressable by a user (e.g., access lines that are outside of a user-addressable address space).

The Iterator bit-vector 433 can be used, for instance, as an indicator of which iteration the determination has performed. For instance, after each iteration the shifted Elem_Mask bit-vector 437 is shifted an additional position to the right to indicate an additional iteration. The Static_Mask 435 is considered a static mask since its value does not change during the determination of the longest element length.

Reference numbers 3 and 4 of the above pseudo code are associated with determining a static mask for determining a longest element length. The static mask is associated with a bit-vector that prevents bits from crossing from one element into a neighboring element when performing a shift operation. That is, while performing a number of shift operations, a bit of a second element is not shifted into a first element. For example, a first element (e.g., stored in cells 303-0 to 303-3) can be stored next to a second element (e.g., stored in cells 303-4 to 303-7). If a bit value stored in cell 303-4 is shifted to the left one position, the bit value would be stored in cell 303-3, which would shift a bit value of the second element into the first element. By performing an operation with the static mask, bits can be prevented from crossing from one element into a neighboring element.

Reference number 3 of the above pseudo code (e.g., "Load Elem_Mask in Comp_Comp and Invert") is associated with loading the Elem_Mask 437 (e.g., [0x88800080]) into the Comp_Comp and inverting the Elem_Mask 437, resulting in [0x777FFF7F] being stored in the Comp_Comp, as illustrated at row 451-3. Reference number 4 of the above pseudo code (e.g., "Shift Left") is associated with shifting each bit of the bit-vector stored in the Comp_Comp 431 (e.g., ~0x777FFF7F) one compute component to the left, resulting in storing bit-vector [0xEEFFFEFE).

Reference number 5 (e.g., "Store as Static_Mask"), is associated with storing the shifted bit-vector (e.g., [0xEEFFFEFE) as Static_Mask 435, as illustrated in row 451-5. That is, the bit-vector [0xEEFFFEFE) is stored in memory cells corresponding to the Static_Mask bit-vector 435.

Reference number 6 (e.g., "Load Elem_Mask in Comp_Comp"), loads the Elem_Mask 437 (e.g., [0x88800080]) into the Comp_Comp 431 (e.g., compute components 331-0 to 331-31 in FIG. 3). Therefore, at the conclusion of the setup phase corresponding to reference numbers 1-6 of the above pseudo code, and as shown in row 451-6 of FIG. 4A, the Comp_Comp 431 stores bit-vector [0x88800080], the Static_Mask 435 stores bit-vector [0xEEFFFEFE], and the Elem_Mask 437 stores bit-vector [0x88800080].

Reference number 7 of the above pseudo code (e.g., "Loop until BlockOR terminates") corresponds to the determination phase of a determination of a longest element length in accordance with a number of embodiments of the present disclosure. Reference number 7 corresponds to a loop (e.g., a "For loop," a "While loop," a "Do while loop," etc.) that comprises execution the pseudo code corresponding to reference numbers 7.*a*-7.*c* until a particular condition is met. In this example, the particular condition is a BlockOR operation terminating (e.g., by returning a "0," or false bit, which indicates that the current bit pattern of Comp_Comp 431 comprises all "0s," e.g., that none of the compute components and/or sense amplifiers corresponding to Comp_Comp 431 store a "1," or true bit). Each iteration of the loop is designated by a number at the end of the row label (e.g., 7.*a* is designated as 7.*a*.1 after a first iteration of the loop, performing 7.*a* of the pseudo code a second time results in a designation of 7.*a*.2, etc.). As such, the determination phase can comprise performing a number of iterations of the pseudo code corresponding to references 7.*a*-7.*c*, with a BlockOR operation being performed at the beginning of each iteration to indicate to proceed with that iteration. A BlockOR operation will be further described below.

The number of times the loop is performed can be based on the length of the longest element. For instance, in this example in which the longest element comprises 16 bits (e.g., the third element comprises 16 bits), the loop can be performed sixteen (16) times (e.g., the BlockOR operation corresponding to reference number 7 terminates after the sixteenth ($16^{th}$) iteration of the primary loop). This is indicated by row 7.*c*.16, which indicates the $16^{th}$ iteration of the loop.

At reference 7.*a*.1 (e.g., "Perform BlockOR"), a BlockOR operation can be performed on the bit-vector stored in the Comp_Comp 431 (e.g., [0x88800080]). In a number of embodiments, a "BlockOR" operation can be performed in association with determining whether one or more (e.g., any) of the compute components (e.g., 331-0 to 331-X) and/or sense amplifiers (e.g., 306-0 to 306-U) coupled to a particular group of sense lines (e.g., 305-0 to 305-S) store a particular data value (e.g., a "1" or a "0"). For example, determining whether any of the compute components 331-0 to 331-31 coupled to sense lines 305-0 to 305-31 store a particular data value can include charging (e.g., precharging) a local I/O line such as local I/O line 334 shown in FIG. 3) to a particular voltage, and then sensing (e.g., via a secondary sense amplifier, such as SSA 312 shown in FIG. 3) whether the voltage on the local I/O line changes (e.g., by more than a threshold amount) responsive to transferring (e.g., in parallel) the voltages corresponding to the data latched in the selected compute components 331-0 to 331-31 to the local I/O line. The I/O line (e.g., I/O line 334) can be precharged via control circuitry such as control circuitry 140 shown in FIG. 1 and/or sensing circuitry such as circuitry 150 shown in FIG. 1, for instance, to a voltage such as a supply voltage (e.g., Vcc) or a ground voltage (e.g., 0V).

Transferring the voltages corresponding to the data latched in the selected compute components 331-0 to 331-31 can include activating (e.g., in parallel) the column decode lines (e.g., column decode lines 310-0 to 310-W in FIG. 3) corresponding to the selected sensing circuitry (e.g., compute components 331-0 to 331-31 in this example) such that respective transistors 308-0 to 308-31 are enabled (e.g., turned on)

As an example, to determine whether one or more of the selected compute components 331-0 to 331-31 stores (e.g., latches) a data value of "1" (e.g., a logic 1 which can be represented by a supply voltage Vcc), the I/O line (e.g., I/O line 334) can be precharged to a ground voltage (e.g., 0V, which can represent a latched data value of "0"). The corresponding column decode lines 310-0 to 310-31 can be activated, and if one or more of the selected compute components 331-0 to 331-31 stores a logic 1 (e.g., Vcc), then the SSA (e.g., SSA 312) can sense a pull up (e.g., increase) of the voltage on the I/O line (e.g., I/O line 334) which indicates that at least one of the selected compute components 331-0 to 331-31 stores a "1," which can be indicated by the BlockOR operation returning a "true" bit (e.g., "1"). In this example, if none of the compute components 331-0 to 331-31 stored a "1," then the voltage on the I/O line would not be pulled up, which can be indicated by the BlockOR operation returning a false bit (e.g., "0").

Alternatively, to determine whether one or more of the selected compute components 331-0 to 331-31 stores (e.g., latches) a data value of "0," the I/O line (e.g., I/O line 334) can be pre-charged to a supply voltage (e.g., Vcc). The corresponding column decode lines 310-0 to 310-31 can be activated, and if one or more of the selected compute components 331-0 to 331-31 stores a logic 0 (e.g., 0V), then the SSA (e.g., SSA 312) can sense a pull down (e.g., decrease) of the voltage on the I/O line (e.g., I/O line 334) which indicates that at least one of the selected compute components 331-0 to 331-31 stores a "0."

The determination of whether one or more compute components (e.g., 331-0 to 331-X) and/or sense amplifiers (e.g., 306-0 to 306-U) coupled to selected column decode lines (e.g., column decode lines 310-0 to 310-W) stores a particular data value (e.g., a data value of "1") is effectively performing a logic "OR" operation (e.g., since the operation returns a "1" if any of the data values are "1" and the operation returns a "0" only if all of the data values are "0"), which is why the operation may be referred to as a "BlockOR" operation. Embodiments of the present disclosure are not limited to particular pre-charge voltages of the local I/O line and/or to particular voltage values corresponding to logic "1" and logic "0".

In this example, the BlockOR operation is determining whether a data value of "1" is stored in at least one compute component. Since bit-vector [0x88800080] includes at least one bit including data value "1", the first iteration of the determination phase continues. At reference 7.*b*.1 (e.g., "Shift Comp_Comp Right"), the bit-vector stored in the Comp_Comp 431 (e.g., [0x88800080]) is shifted one compute component to the right. That is, bit-vector [0x88800080] stored in the Comp_Comp 431 is shifted to result in bit-vector [0x44400040] being stored in the Comp_Comp 431, as illustrated at row 451-7.*b*.1.

At reference 7.*c*.1 (e.g., "Perform AND with Static_Mask and Add 1 to Longest"), an AND operation is performed on the bit-vector stored in the Comp_Comp 431 (e.g., [0x44400040]) and the Static_Mask 435 (e.g., [0xEEFFFEFE]). As an example, the result of a logical AND operation performed on a first bit-vector "a" and a second bit-vector "b" is a bit-vector whose MSB is the result of "ANDing" the MSB of bit-vector "a" and the MSB of bit-vector "b," whose next MSB is the result of ANDing the next MSBs of bit-vectors "a" and "b, and whose LSB is the result of ANDing the LSB of bit-vector "a" and the LSB of bit-vector "b." For instance, performing an AND operation on a bit-vector [1110] and on bit-vector [1000] would result in bit-vector [1000] (e.g., the MSB of the resultant bit-vector is "1" since "1" AND "1" is "1", the next MSB is "0" since "1" AND "0" is "0", the next MSB is "0" since "1" AND "0" is "0", and the LSB is "0" since "0" AND "0" is "0"). The result of the AND operation (e.g., [0x44400040]) is retained in the Comp_Comp 431. An addition of one value is added to the Longest 439 column (e.g., a "1" is added to the current value of 0) as a counter of how many positions we have moved to determine a longest element length.

An example addition operation, described below in reference to FIG. 4B, can be performed in association with adding an example element A (e.g., [0010]) with an example element B (e.g., [0001]). For example, a first element (e.g., [0010]) can have a "1" added to the element (e.g., by adding element B of [0001]). The ADD operation is associated with the following pseudocode below.

```
0.     Load elements A, B, Get Temp C, CARRY
1.     For All Elements, Starting With LSB, C = A XOR B
   1.a    Starting with LSB, CARRY = A AND B
   1.b    If Any Bits in CARRY true, then
      1.b.i   CARRY = Down Shift Carry
      1.b.ii  C = C XOR CARRY
```

Reference number 0 (e.g., "Load elements A, B, Get Temp C, CARRY") of the above pseudocode is associated with loading element A (e.g., [0010]) and element B (e.g., [0001]) as elements A 464 and B 466. In addition, temporary storage rows C and CARRY are initialized.

Reference number 1 (e.g., "For All Elements, Starting with LSB, C=A XOR B") of the above pseudocode is associated with performing an XOR operation on bit position corresponding to a particular iteration (e.g., in a first iteration, a LSB, in a second iteration a second least significant bit, in a third iteration, a second most significant bit, and in a fourth iteration, a most significant bit position). For example, XORing LSBs of A and B (e.g., bolded bits of [0000] and [0001]) results in element [0001] being stored as C 468 as illustrated at 453-1.1.

Reference number 1.a (e.g., "Starting LSB, CARRY=A AND B") of the above pseudocode is associated with starting with a least significant bit (LSB) position corresponding to a particular iteration (e.g., in a first iteration, a LSB, in a second iteration a second least significant bit, in a third iteration a second most significant bit, and in a fourth iteration, a most significant bit position). For example, in this first iteration, an LSB bit of A 464 (e.g., bolded bit [0010]) is ANDed with an LSB of B 466 (e.g., bolded bit [0001]), resulting in element [0000] stored as CARRY 462. A BlockOR (as described above) is performed to determine if any bits of CARRY 462 are "true" (e.g., include a "1"). Since no bits include a "true" bit during the first iteration, reference numbers 1.b.i and 1.b.ii are not performed. However, for example, had a CARRY element been [0001], the CARRY element [0001] would have been shifted to result in [0010] and XORed with C (e.g., [0001]), resulting in [0011].

During a second iteration, reference number 1 (e.g., "For All Elements, Starting with LSB, C=A XOR B") of the above pseudocode is associated with performing an XOR operation on bit position corresponding to a particular iteration (e.g., in a second iteration). For example, XORing a second least significant bit and LSBs of A and B (e.g., bolded bits of [0010] and [0001]) results in element [0011] being stored as C 468 as illustrated at 453-1.2.

Reference number 1.a (e.g., "Starting LSB, CARRY=A AND B" for a second iteration associated with 453-1.2a) of the above pseudocode is associated with starting with a second least significant bit (LSB) position corresponding to a particular iteration (e.g., in a second iteration). For example, in this second iteration, a second least significant bit of A 464 (e.g., bolded bit [0010]) is ANDed with a second LSB of B 466 (e.g., bolded bit [0001]), resulting in element [0000] stored as CARRY 462. A BlockOR (as described above) is performed to determine if any bits of CARRY 462 are "true" (e.g., include a "1"). Since no bits include a "true" bit during the second iteration, reference numbers 1.b.i and 1.b.ii are not performed.

During a third and fourth iteration, CARRY 462 remains [0000] and element C 468 remains [0011]. Since CARRY 462 remains [0000], there is no shifting associated with numbers 1.bi and 1.bii. The result of the addition operation on A 464 (e.g., [0010]) and B 466 (e.g., [0001]), results in element [0011].

At reference 7.a.2 (e.g., second iteration of "Perform BlockOR"), a BlockOR operation is performed on the bit-vector stored in the Comp_Comp 431 (e.g., [0x44400040]). Since bit-vector [0x44400040] includes at least one bit value of "1", the iteration continues. At reference 7.b.2 (e.g., second iteration of "Shift Comp_Comp Right"), the bit-vector in the Comp_Comp 431 is shifted right resulting in bit-vector [0x22200020] being retained in the Comp_Comp 431, as illustrated at row 451-7.c.2. At reference 7.c.2 (e.g., second iteration of "Perform AND with Static_Mask and Add 1 to Longest"), an AND operation is performed on the bit-vector stored in the Comp_Comp 431 (e.g., [0x22200020]) and the Static_Mask 435 (e.g., [0xEEFFFEFE). An addition of one value is added to the Longest 439 column (e.g., a value of one (1) is added to the current value of "1" already stored in the memory cells corresponding to Longest 439).

At reference 7.a.3 (e.g., third iteration of "Perform BlockOR"), a BlockOR operation is performed on the bit-vector stored in the Comp_Comp 431 (e.g., [0x22200020]). Since bit-vector [0x22200020] includes at least one bit value of "1", the iteration continues. At reference 7.b.3 (e.g., third iteration of "Shift Comp_Comp Right"), the bit-vector in the Comp_Comp 431 is shifted right resulting in bit-vector [0x11100010] being retained in the Comp_Comp 431, as illustrated at row 451-7.c.3. At reference 7.c.3 (e.g., third iteration of "Perform AND with Static_Mask and Add 1 to Longest"), an AND operation is performed on the bit-vector stored in the Comp_Comp 431 (e.g., [0x11100010]) and the Static_Mask 435 (e.g., [0xEEFFFEFE). An addition of one value is added to the Longest 439 column (e.g., one value is added to the current value of "2" already stored as the Longest 439) resulting in a 3 being stored as the Longest 439.

At reference 7.a.4 (e.g., fourth iteration of "Perform BlockOR"), a BlockOR operation is performed on the bit-vector stored in the Comp_Comp 431 (e.g., [0x11100010]). Since bit-vector [0x11100010] includes at least one bit value of "1", the iteration continues. At reference 7.b.4 (e.g., fourth iteration of "Shift Comp_Comp Right"), the bit-vector in the Comp_Comp 431 is shifted right resulting in bit-vector [0x08880008] being retained in the Comp_Comp 431, as illustrated at row 451-7.b.4. At reference 7.c.4 (e.g., fourth iteration of "Perform AND with Static_Mask and Add 1 to Longest"), an AND operation is performed on the bit-vector stored in the Comp_Comp 431 (e.g., [0x08880008]) and the Static_Mask 435 (e.g., [0xEEFFFEFE]), resulting in bit-vector [0x00080008], as illustrated at row 451-7.c.4. The fourth iteration demonstrates the importance of the static mask. When an AND operation is performed with the static mask, a data value that is shifted from one element to a neighboring element is corrected by preventing it from crossing over. That is, the "088" in [0x08880008] stored in the Comp_Comp 431 prior to the AND operation in the fourth iteration, becomes "000" by ANDing with the static mask and thereby preventing movement from one element to a neighboring element. An addition of one value is added to the Longest 439 column (e.g., one value is added to the current value of "3" already stored as the Longest 439) resulting in a 4 being stored as the Longest 439.

At reference 7.*a*.5 (e.g., fifth iteration of "Perform BlockOR"), a BlockOR operation is performed on the bit-vector stored in the Comp_Comp 431 (e.g., [0x00080008]). Since bit-vector [0x00080008] includes at least one bit value of "1", the iteration continues. At reference 7.*b*.5 (e.g., fifth iteration of "Shift Comp_Comp Right"), the bit-vector in the Comp_Comp 431 is shifted right resulting in bit-vector [0x00040004] being retained in the Comp_Comp 431, as illustrated at row 451-7.*c*.5. At reference 7.*c*.5 (e.g., fourth iteration of "Perform AND with Static_Mask and Add 1 to Longest"), an AND operation is performed on the bit-vector stored in the Comp_Comp 431 (e.g., [0x00040004]) and the Static_Mask 435 (e.g., [0xEEFFFEFE]), resulting in bit-vector [0x00040004], as illustrated at row 451-7.*c*.5. An addition of a value of one is added to the Longest 439 column (e.g., a value of one is added to the current value of "4" already stored as the Longest 439) resulting in a 5 being stored as the Longest 439.

For ease of reference, illustrations of pseudo code I and II of iterations 6 through 16 have been omitted from FIG. 4A. Pseudo code associated with c has been illustrated to demonstrate how each iteration concludes. The sixth iteration concludes with bit-vector [0x00020002] being stored in the Comp_Comp 431 and the Longest 439 being a value of 6, as illustrated at row 451-7.*c*.6. The seventh iteration concludes with bit-vector [0x00010001] stored in the Comp_Comp 431 and the Longest 439 being a value of 7, as illustrated at row 451-7.*c*.7. The eighth iteration concludes with bit-vector [0x00008000] stored in the Comp_Comp 431 and the Longest 439 being a value of 8, as illustrated at row 451-7.*c*.8. The ninth iteration concludes with bit-vector [0x00004000] stored in the Comp_Comp 431 and the Longest 439 being a value of 9, as illustrated at row 451-7.*c*.9. The tenth iteration concludes with bit-vector [0x00002000] stored in the Comp_Comp 431 and the Longest 439 being a value of 10, as illustrated at row 451-7.*c*.10. The eleventh iteration concludes with bit-vector [0x00001000] stored in the Comp_Comp 431 and the Longest 439 being a value of 11, as illustrated at row 451-7.*c*.11. The twelfth iteration concludes with bit-vector [0x00000800] stored in the Comp_Comp 431 and the Longest 439 being a value of 12, as illustrated at row 451-7.*c*.12. The thirteenth iteration concludes with bit-vector [0x00000400] stored in the Comp_Comp 431 and the Longest 439 being a value of 13, as illustrated at row 451-7.*c*.13. The fourteenth iteration concludes with bit-vector [0x00000200] stored in the Comp_Comp 431 and the Longest 439 being a value of 14, as illustrated at row 451-7.*c*.14. The fifteenth iteration concludes with bit-vector [0x00000100] stored in the Comp_Comp 431 and the Longest 439 being a value of 15, as illustrated at row 451-7.*c*.15. The sixteenth iteration concludes with bit-vector [0x00000000] stored in the Comp_Comp 431 and the Longest 439 being a value of 16, as illustrated at row 451-7.*c*.16. The seventeenth iteration would not conclude because the BlockOR to start the seventeenth iteration would determine that bit-vector [0x00000000] does not include a data value of "1" and would therefore terminate the loop. The Biggest 439 would indicate a 16, showing that the longest element is sixteen (16) bits in length.

A determination of a length of a longest element of a plurality of variable length elements can be used when performing a number of operations (e.g., mathematical operations such as additions, subtractions, multiplications, and/or divisions, among various other operations which may involve performing a number of logical operations such as AND operations, OR operations, for example). For instance, performing mathematical operations on elements stored in an array can involve performing a number of iterations of a loop, and the number of iterations to be performed can be based on the particular length (e.g., number of bits) of elements. For example, multiplying two 8-bit elements may involve performing 8 iterations of a particular loop (e.g., one iteration for each of the number of bits in the elements). In such instances, it can be beneficial to avoid performing more than a minimum number of loops in order to improve throughput, reduce power consumption, etc. As such, determining the length of the longest element prior to performing the iterations can be useful. Once a determination of the longest element is made (e.g., such as 16 in the example above), a number of operations can be performed based on the length of the longest element (e.g., performed 16 times, 8 times if it's half of the length, etc.).

A determination of the length of the longest element can be performed while performing the number of operations whose number of iterations are dependent on the length of the longest element. The Psuedocode II referenced above can be used to perform the operations within the longest element determination. That is, references 1-6 associated with the setup phase are identical to the description in the above example except that at reference 2, the Elem_Mask 437 is stored as the Iterator 433, as illustrated at row 451-2 in FIG. 4A.

The determination phase (e.g., references 7.*a* through 7.*c*) associated with Pseudo code II can have a variation as compared to that of Pseudo code I. At reference 7.*a*.1 (e.g., "Perform BlockOR and loop of operation), the first iteration of the operation dependent on the length of the element is performed after the BlockOR determines there is at least one data value of "1" in the plurality of variable length elements. At reference 7.*b*.1 (e.g., "Load Iterator into Comp_Comp, Shift Comp_Comp Right"), the Load Iterator bit-vector 433 (e.g., [0x88800080]) is loaded into the Comp_Comp 431. Each bit of the bit-vector stored in the Comp_Comp 431 is shifted one compute component to the right, resulting in bit-vector [0x44400040] being stored in the Comp_Comp 431, as illustrated at 7.*c*.1. At reference 7.*c*.1 (e.g., "Perform AND with Static_Mask, Add 1 to Longest, and Store Comp_Comp in Iterator"), the bit-vector stored in the Comp_Comp 431 (e.g., [0x44400040]) is ANDed with the Static_Mask 435 (e.g., [0xEEFFFEFE), resulting in bit-vector [0x44400040] being retained in the Comp_Comp 431, as illustrated at row 451-7.*c*.1. The Longest 439 goes from no value to a "1," just as in the previous example. However, in this second example, the bit-vector stored in the Comp_Comp 431 (e.g., [0x44400040]) is stored as the Iterator 433, as illustrated at 451.7.*c*.1. Therefore, at each iteration of the pseudo code, the bit-vectors are stored and operations are performed on the bit-vectors in the same way as the first example, except that a bit-vector is loaded prior to each iteration from the Iterator 433 and stored subsequent to each iteration as the Iterator 433, as illustrated in the Iterator 433 column. In addition, an operation is performed subsequent to each BlockOR operation just as a value would be added to the Longest 439. The Longest 439 value is irrelevant to the second example except if a longest length at the end of the operations and longest length determination is important to know even though the operations have already been performed.

Figure 5A:
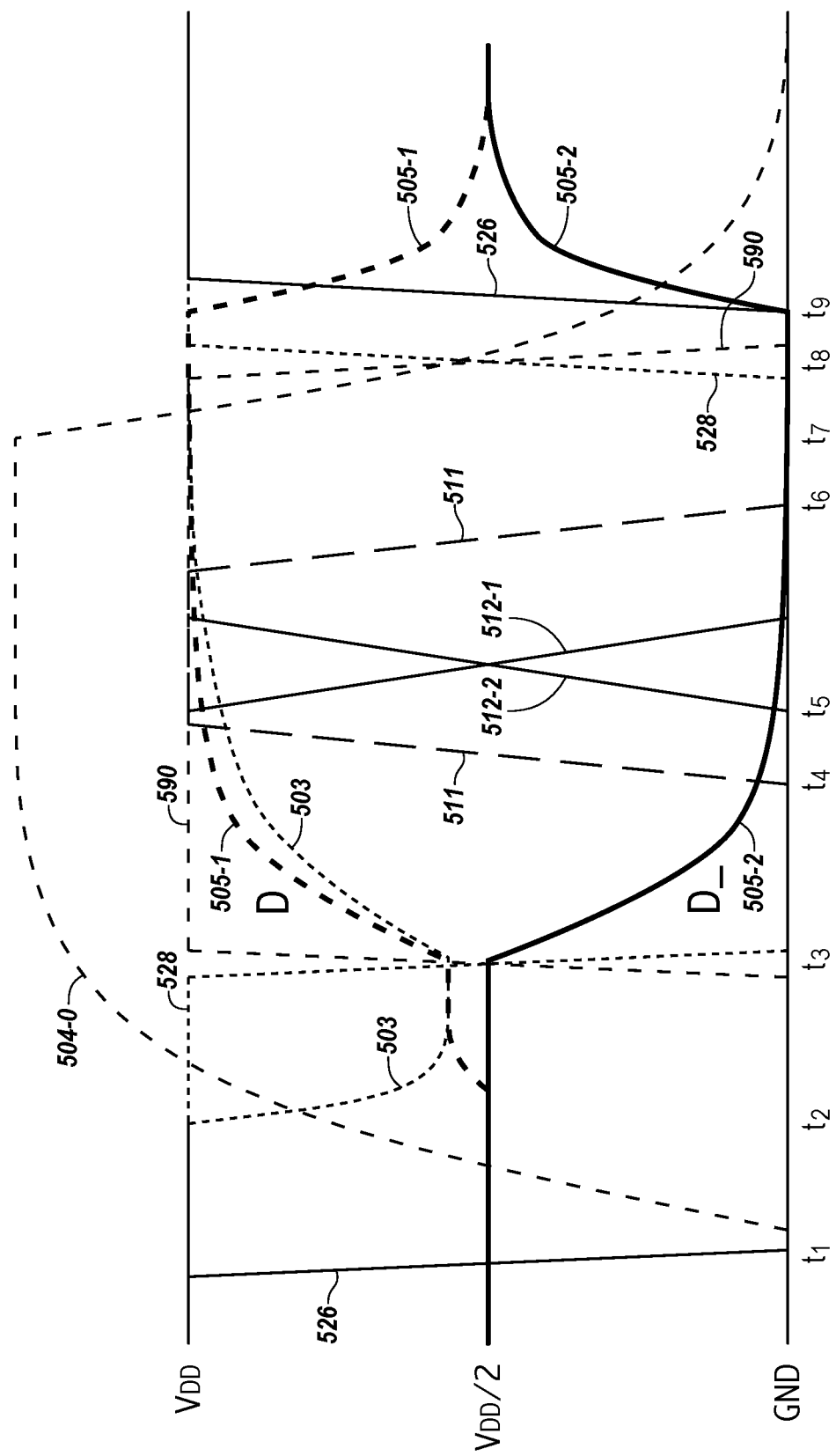
FIGS. 5A-5D illustrate timing diagrams associated with performing a number of logical operations using sensing circuitry in accordance with a number of embodiments of the present disclosure.

FIG. 5A illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the accumulator). The timing diagram shown in FIG. 5A illustrates signals (e.g., voltage signals) associated with performing a first operation phase of a logical operation (e.g., an R-input logical operation) using the sensing circuitry illustrated in FIG. 2A. The first operation phase described with respect to FIG. 5A can be a first operation phase of an AND, NAND, OR, or NOR operation, for instance. Performing the operation phase illustrated in FIG. 5A can involve consuming significantly less energy (e.g., about half) than previous processing approaches that may involve providing a full swing between voltage rails (e.g., between a supply and ground).

In the example illustrated in FIG. 5a, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 5A do not necessarily represent a same absolute or relative time as similar time references in other timing diagrams.

At time $t_1$, the equilibration signal 526 is deactivated, and then a selected row is enabled (e.g., the row corresponding to a memory cell whose data value is to be sensed and used as a first input). Signal 504-0 represents the voltage signal applied to the selected row (e.g., Row Y 204-Y shown in FIG. 2A). When row signal 504-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1T1C DRAM cell), which creates a differential voltage signal between the data lines D and D_ (e.g., as indicated by signals 505-1 and 505-2 on the data lines, respectively) between times $t_2$ and $t_3$. The voltage of the selected cell is represented by signal 503. Due to conservation of energy, creating the differential signal between data lines D and D_ (e.g., by coupling the cell to data line D) does not consume energy, since the energy associated with enabling/disabling the row signal 504-0 can be amortized over the plurality of memory cells coupled to the row.

At time $t_3$, the sense amplifier (e.g., 206 shown in FIG. 2A) is enabled (e.g., a positive control signal 590 (e.g., corresponding to ACT 290 shown in FIG. 2B) goes high and the negative control signal 528 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 5A shows, in example, the data line voltages 505-1 and 505-2 that correspond to a logic "1" being on data line D.

According to some embodiments, the primary latch of sense amplifier 206 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The Passd control signal 511 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 511 applied to control lines coupled to the respective gates of the pass transistors going high). At time $t_5$, the accumulator positive control signal 512-1 (e.g., Accumb) and the accumulator positive control signal 512-2 (e.g., Accum) are activated via respective control lines 212-1 and 212-2 shown in FIG. 2A. As described below, the accumulator control signals ACCUMB 1412-1 and ACCUM 512-2 may remain activated for subsequent operation phases. As such, in this example, activating the control signals ACCUMB 512-1 and ACCUM 512-2 enables the secondary latch (e.g., accumulator) of compute component 231 shown in FIG. 2A. The sensed data value stored in sense amplifier 206 is transferred (e.g., copied) to the secondary latch, including the dynamic latch and latch 264.

At time $t_6$, the Passd control signal 511 (and the Passdb control signal) goes low thereby turning off the pass transistors (if present). However, since the accumulator control signals ACCUMB 512-1 and ACCUM 512-2 remain activated, an accumulated result is stored (e.g., latched) in the secondary latches (e.g., accumulator). At time $t_7$, the row signal 504-0 is deactivated, and the array sense amps are disabled at time $t_8$ (e.g., sense amplifier control signals 528 and 590 are deactivated).

At time $t_9$, the data lines D and D_ are equilibrated (e.g., equilibration signal 526 is activated), as illustrated by data line voltage signals 505-1 and 505-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 5B:
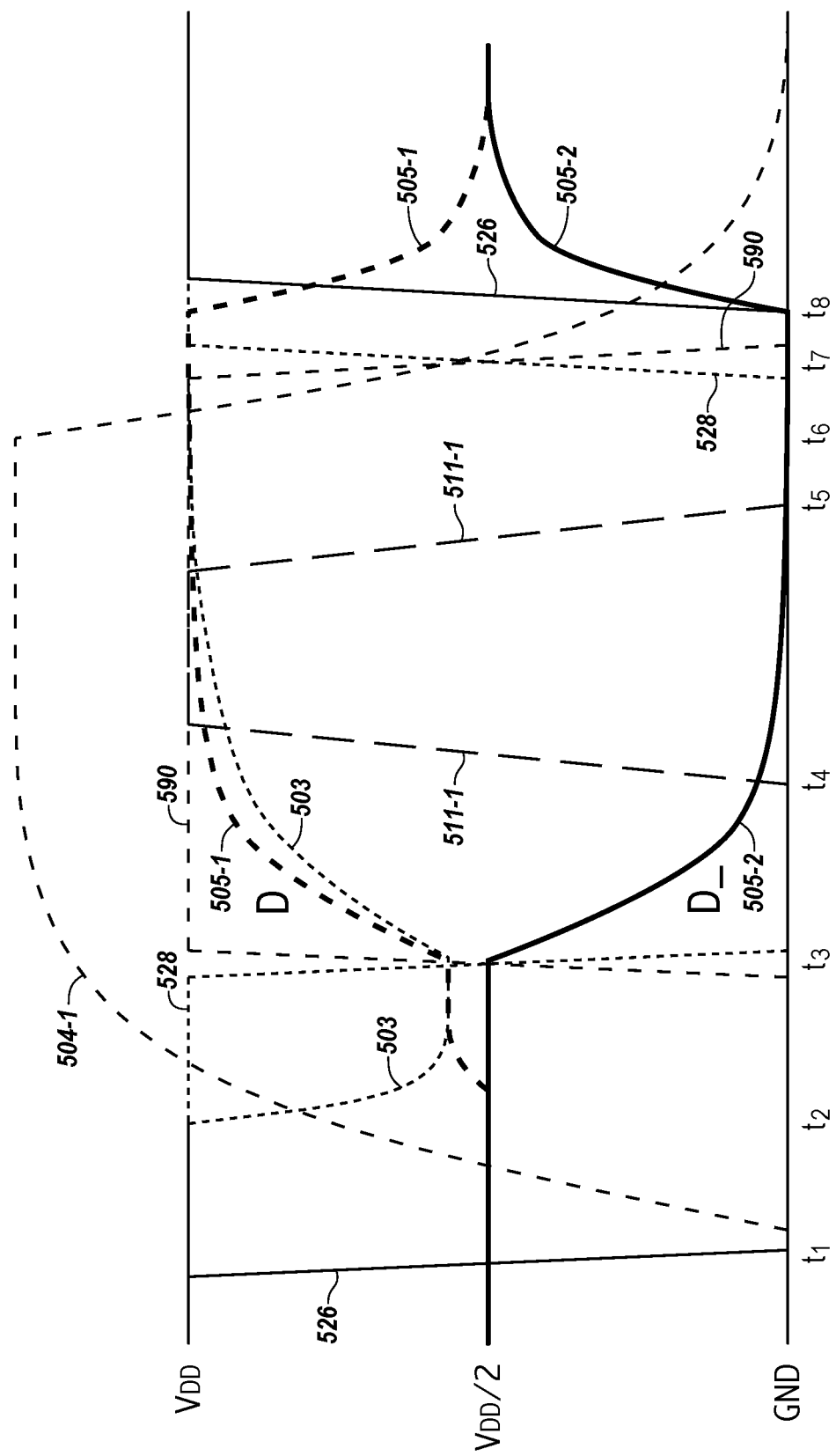
Figure 5C:
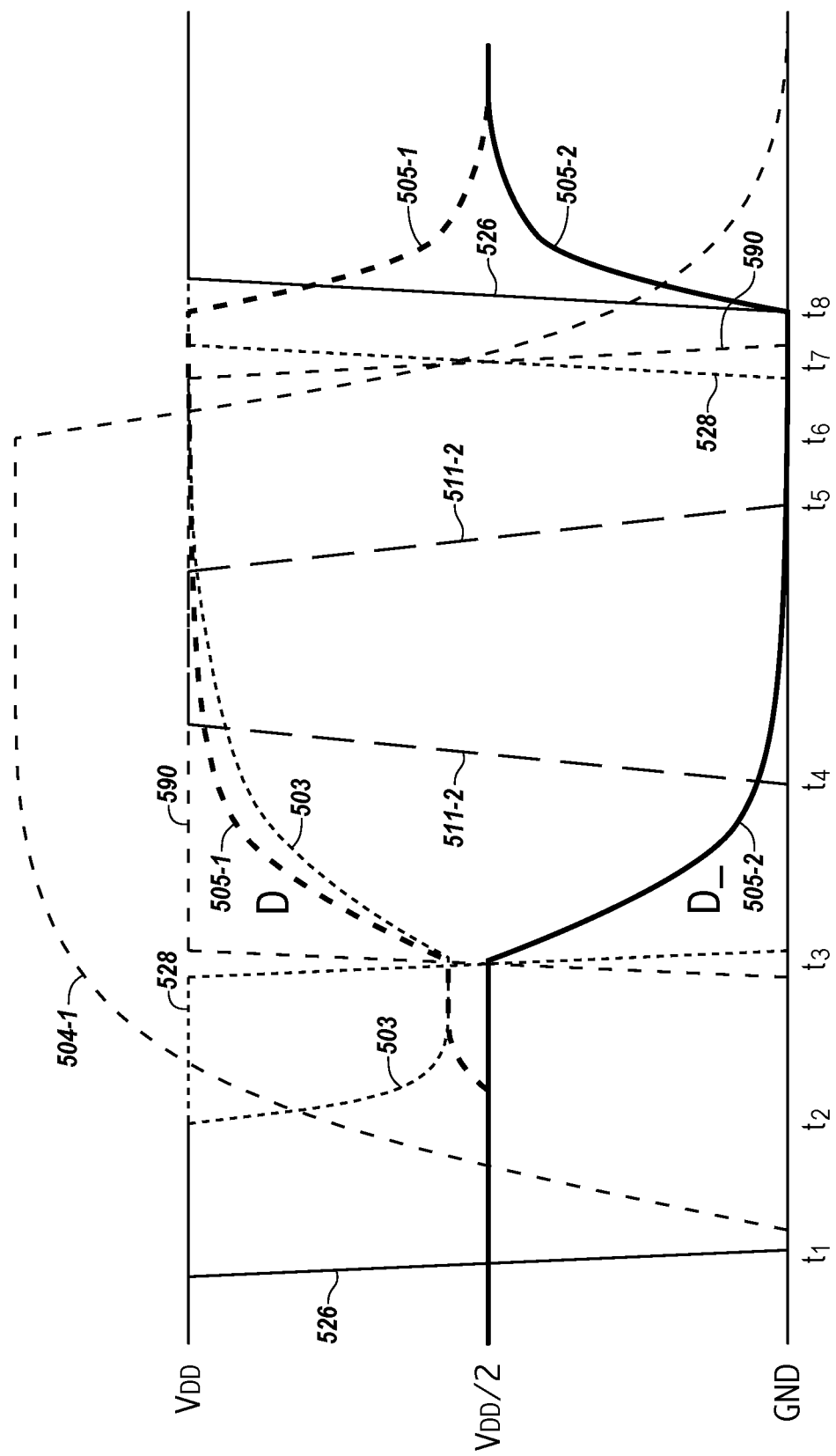

FIGS. 5B and 5C respectively illustrate timing diagrams associated with performing a number of logical operations using sensing circuitry in accordance with a number of embodiments of the present disclosure. Timing diagrams shown in FIGS. 5B and 5C illustrate signals (e.g., voltage signals) associated with performing a number of intermediate operation phases of a logical operation (e.g., an R-input logical operation). For instance, timing diagram shown in FIG. 5B corresponds to a number of intermediate operation phases of an R-input NAND operation or an R-input AND operation, and timing diagram shown in FIG. 5C corresponds to a number of intermediate operation phases of an R-input NOR operation or an R-input OR operation. For example, performing an AND or NAND operation can include performing the operation phase shown in FIG. 5B one or more times subsequent to an initial operation phase such as that described with respect to FIG. 5A. Similarly, performing an OR or NOR operation can include performing the operation phase shown and described with respect to FIG. 5C one or more times subsequent to an initial operation phase such as that described with respect to FIG. 5A.

As shown in the timing diagrams illustrated in FIGS. 5B and 5C, at time $t_1$, equilibration is disabled (e.g., the equilibration signal 526 is deactivated), and then a selected row is enabled (e.g., the row corresponding to a memory cell whose data value is to be sensed and used as an input such as a second input, third input, etc.). Signal 504-1 represents the voltage signal applied to the selected row (e.g., Row Y 204-Y shown in FIG. 2A). When row signal 504-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to data line D) does not consume energy, since the energy associated with activating/deactivating the row signal 504-1 can be amortized over the plurality of memory cells coupled to the row.

At time $t_3$, the sense amplifier (e.g., 206 shown in FIG. 2A) is enabled (e.g., a positive control signal 590 (e.g., corresponding to ACT 233 shown in FIG. 2B) goes high, and the negative control signal 528 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$.

As shown in timing diagrams illustrated in FIGS. 5B and 5C, at time $t_4$ (e.g., after the selected cell is sensed), only one of control signals 511-1 (Passd) shown in FIG. 5B and 511-2 (Passdb) shown in FIG. 5C is activated (e.g., only one of pass transistors (if present) is enabled), depending on the particular logic operation. For example, since the timing diagram illustrated in FIG. 5B corresponds to an intermediate phase of a NAND or AND operation, control signal 511-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 5C corresponds to an intermediate phase of a NOR or OR operation, control signal 511-2 (Passdb) is activated at time t4 to turn on the pass transistor coupling the primary latch to data line D_ and control signal Passd remains deactivated leaving the pass transistor coupling the primary latch to data line D turned off. Recall from above that the accumulator control signals 512-1 (Accumb) and 512-2 (Accum) were activated during the initial operation phase described with respect to FIG. 5A, and they remain activated during the intermediate operation phase(s).

Since the accumulator was previously enabled, activating only Passd (511-1 as shown in FIG. 5B) results in accumulating the data value corresponding to the voltage signal 505-1 shown in FIG. 5B corresponding to data line D. Similarly, activating only Passdb (511-2 as shown in FIG. 5C) results in accumulating the data value corresponding to the voltage signal 505-2 corresponding to data line D_. For instance, in an example AND/NAND operation shown in the timing diagram illustrated in FIG. 5B in which only Passd (511-1) is activated, if the data value stored in the second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 5C in which only Passdb 511-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 505-2 on D_ is setting the true data value of the accumulator.

At the conclusion of an intermediate operation phase such as that shown in FIG. 5B or 5C, the Passd signal 511-1 (e.g., for AND/NAND) or the Passdb signal 511-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 5B or 5C can be repeated in order to accumulate results from a number of additional rows. As an example, the sequence of timing diagram illustrated in FIGS. 5B and/or 5C can be performed a subsequent (e.g., second) time for a third memory cell, a subsequent (e.g., third) time for a fourth memory cell, etc. For instance, for a 10-input NOR operation, the intermediate phase shown in FIG. 5C can occur 9 times to provide 9 inputs of the 10-input logical operation, with the tenth input being determined during the initial operation phase (e.g., as described with respect to FIG. 5A).

Figure 5D:
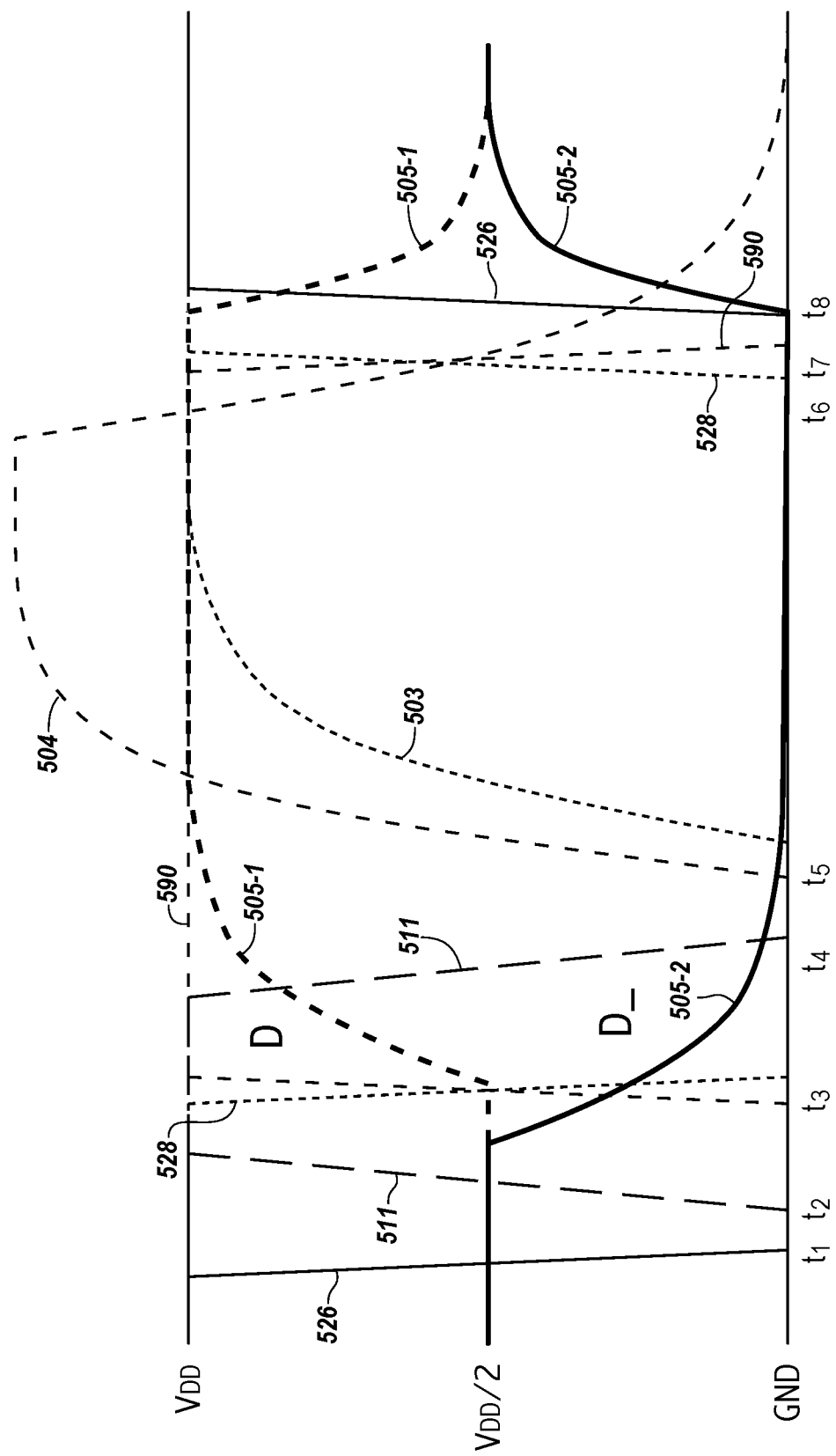

FIG. 5D illustrates a timing diagram associated with performing a number of logical operations using sensing circuitry in accordance with a number of embodiments of the present disclosure. The timing diagram illustrated in FIG. 5D shows signals (e.g., voltage signals) associated with performing a last operation phase of a logical operation (e.g., an R-input logical operation). For instance, the timing diagram illustrated in FIG. 5D corresponds to a last operation phase of an R-input AND operation or an R-input OR operation.

For example, performing a last operation phase of an R-input can include performing the operation phase shown in FIG. 5D subsequent to a number of iterations of the intermediate operation phase(s) described in association with FIGS. 5B and/or 5C. Table 3 shown below indicates the Figures corresponding to the sequence of operation phases associated with performing a number of R-input logical operations in accordance with a number of embodiments described herein.

TABLE 3

| Operation | FIG. 5A | FIG. 5B | FIG. 5C | FIG. 5D |
|---|---|---|---|---|
| AND | First phase | R-1 iterations | | Last phase |
| NAND | First phase | R-1 iterations | | |

TABLE 3-continued

| Operation | FIG. 5A | FIG. 5B | FIG. 5C | FIG. 5D |
|---|---|---|---|---|
| OR | First phase | | R-1 iterations | Last phase |
| NOR | First phase | | R-1 iterations | |

A NAND operation can be implemented, for example, by storing the result of the R−1 iterations for an AND operation in the sense amplifier, then inverting the sense amplifier before conducting the last operation phase to store the result (described below). A NOR operation can be implemented, for example, by storing the result of the R−1 iterations for an OR operation in the sense amplifier, then inverting the sense amplifier before conducting the last operation phase to store the result (described below).

The last operation phase illustrated in the timing diagram of FIG. 5D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 5D, at time equilibration is disabled (e.g., the equilibration signal 526 is deactivated) such that data lines D and D_ are floating. At time t2, the Passd control signal 511 (and Passdb signal) is activated for an AND or OR operation.

Activating the Passd control signal 511 (and Passdb signal) (e.g., in association with an AND or OR operation) transfers the accumulated output stored in the secondary latch of compute component 231 shown in FIG. 2A to the primary latch of sense amplifier 206. For instance, for an AND operation, if any of the memory cells sensed in the prior operation phases (e.g., the first operation phase illustrated in FIG. 5A and one or more iterations of the intermediate operation phase illustrated in FIG. 5B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206 is then enabled (e.g., a positive control signal 290 (e.g., corresponding to ACT 290 shown in FIG. 2B) goes high and the negative control signal 528 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 5A and one or more iterations of the intermediate operation phase shown in FIG. 5C) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 5D, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 5D show, at time t3, the positive control signal 590 and the negative control signal 528 being deactivated (e.g., signal 590 goes high and signal 528 goes low) to disable the sense amplifier 206 shown in FIG. 2A. At time t4 the Passd control signal 511 (and Passdb signal) that was activated at time t2 is deactivated. Embodiments are not limited to this example. For instance, in a number of embodiments, the sense amplifier 206 shown in FIG. 2A may be enabled subsequent to time t4 (e.g., after he Passd control signal 511 (and Passdb signal) are deactivated).

As shown in FIG. 5D, at time t5, a selected row is enabled (e.g., by row activation signal 504 going high, which drives the capacitor of the selected cell to the voltage corresponding to the logic value stored in the accumulator. At time t6 the selected row is disabled. At time t7 the sense amplifier 206 shown in FIG. 2A is disabled (e.g., positive control signal 528 and negative control signal 590 are deactivated in FIG. 5D), and at time t8 equilibration occurs (e.g., signal 526 is activated and the voltages on the complementary data lines 505-1 (D) and 505-2 (D_) are brought to the equilibration voltage, as shown in FIG. 5D).

Although the example of performing a last operation phase of an R-input was discussed above with respect to FIG. 5D for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

The functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., accumulator) of a compute component 231, and then be subsequently transferred to the sense amplifier 206, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., accumulator) to the sense amplifier 206) is advantageous because, for instance, the result can be written to a row (of the array of memory cells) or back into the accumulator without performing a precharge cycle (e.g., on the complementary data lines 205-1 (D) and/or 205-2 (D_)).

Figure 6A:
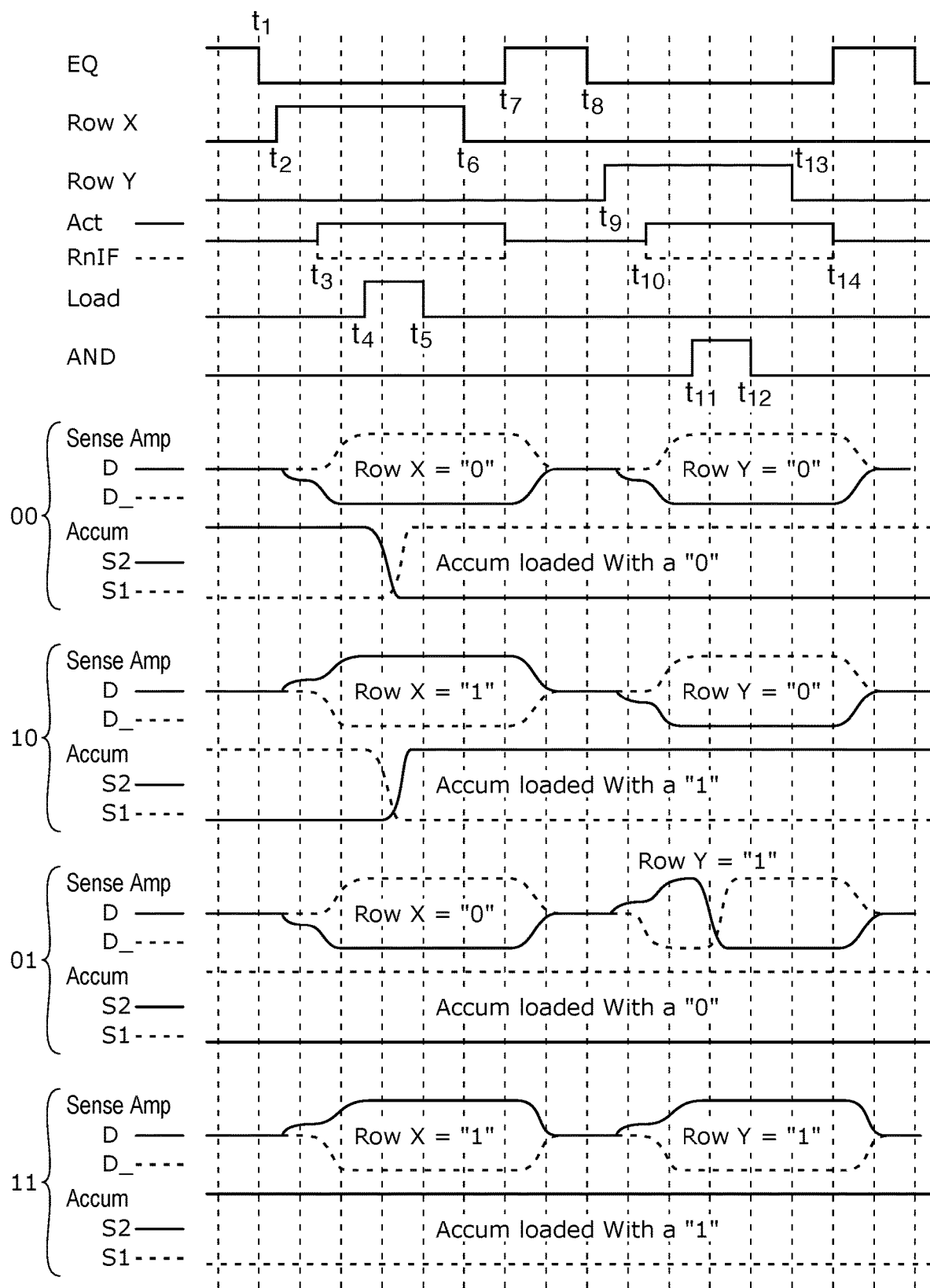
FIGS. 6A-6B illustrate timing diagrams associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. FIG. 6A illustrates a timing diagram associated with initiating an AND logical operation on a first operand and a second operand. In this example, the first operand is stored in a memory cell coupled to a first access line (e.g., ROW Y) and the second operand is stored in a memory cell coupled to a second access line (e.g., ROW X). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 6A illustrates a number of control signals associated with operating sensing circuitry (e.g., 250 in FIG. 2A) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 6A also illustrates the waveform diagrams showing the signals (e.g., voltage signals) on the digit lines D and D_ corresponding to sense amp 206 and on the nodes S1 and S2 corresponding to the compute component 231 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:
  Copy Row X into the Accumulator:
  Deactivate EQ;
  Open Row X;
  Fire Sense Amps (after which Row X data resides in the sense amps);
  Activate LOAD (sense amplifier data (Row X) is transferred to nodes S1 and S2 of the Accumulator and resides there dynamically);
  Deactivate LOAD;
  Close Row X;
  Precharge;

In the pseudo code above, "Deactivate EQ" indicates that an equilibration signal (EQ signal shown in FIG. 6A) corresponding to the sense amplifier 206 is disabled at $t_1$ as shown in FIG. 6A (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 6A. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is enabled, in the pseudo code above, "Fire Sense Amps" indicates that the sense amplifier 206 is enabled to set the primary latch and subsequently disabled. For example, as shown at $t_3$ in FIG. 6A, the ACT positive control signal (e.g., 290 shown in FIG. 2B) goes high and the RnIF negative control signal (e.g., 228 shown in FIG. 2B) goes low, which amplifies the differential signal between 205-1 (D) and D_ 205-2, resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 6A (e.g., one for each combination of Row X and Row Y data values) shows the behavior of signals on data lines D and D_. The Row X data value is stored in the primary latch of the sense amp. It should be noted that FIG. 2A shows that the memory cell including storage element 202-2, corresponding to Row X, is coupled to the complementary data line D_, while the memory cell including storage element 202-1, corresponding to Row Y, is coupled to data line D. However, as can be seen in FIG. 2A, the charge stored in memory cell 202-2 (corresponding to Row X) corresponding to a "0" data value causes the voltage on data line D_ (to which memory cell 202-2 is coupled) to go high and the charge stored in memory cell 202-2 corresponding to a "1" data value causes the voltage on data line D_ to go low, which is opposite correspondence between data states and charge stored in memory cell 202-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 6A, causing load/pass transistors 218-1 and 218-2 to conduct. In this manner, activating the LOAD control signal enables the secondary latch in the accumulator of the compute component 231. The sensed data value stored in the sense amplifier 206 is transferred (e.g., copied) to the secondary latch. As shown for each of the four sets of possible sense amplifier and accumulator signals illustrated in FIG. 6A, the behavior at inputs of the secondary latch of the accumulator indicates the secondary latch is loaded with the Row X data value. As shown in FIG. 6A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at $t_5$ in FIG. 6A to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 6A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 6A by the EQ signal going high at $t_7$. As shown in each of the four sets of possible sense amplifier and accumulator signals illustrated in FIG. 6A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231 shown in FIG. 2A) and the second data value (stored in a memory cell 202-1 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

Deactivate EQ;
Open Row Y;
Fire Sense Amps (after which Row Y data resides in the sense amps);
Close Row Y;
The result of the logic operation, in the next operation, will be placed on the sense amp, which will overwrite any row that is active.
Even when Row Y is closed, the sense amplifier still contains the Row Y data value.
Activate AND;
This results in the sense amplifier being written to the value of the function (e.g., Row X AND Row Y);

If the accumulator contains a "0" (i.e., a voltage corresponding to a "0" on node S2 and a voltage corresponding to a "1" on node S1), the sense amplifier data is written to a "0";

If the accumulator contains a "1" (i.e., a voltage corresponding to a "1" on node S2 and a voltage corresponding to a "0" on node S1), the sense amplifier data remains unchanged (Row Y data);

This operation leaves the data in the accumulator unchanged.

Deactivate AND;
Precharge;

In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 6A at $t_8$. After equilibration is disabled, a selected row (e.g., ROW Y) is enabled as indicated in the pseudo code above by "Open Row Y" and shown in FIG. 6A at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). As shown at $t_{10}$ in FIG. 6A, the ACT positive control signal (e.g., 290 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 6A shows that Row Y is left enabled such that the result of the logical operation can be stored back in the memory cell corresponding to Row Y. Isolating the memory cell corresponding to Row Y can be accomplished by the access transistor turning off to decouple the selected cell 202-1 from the data line 205-1 (D). After the selected Row Y is configured (e.g., to isolate the memory cell or not isolate the memory cell), "Activate AND" in the pseudo code above indicates that the AND control signal goes high as shown in FIG. 6A at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the accumulator unchanged (e.g., from Row X).

If the secondary latch of the accumulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206, "Deactivate AND" in the pseudo code above indicates that the AND control signal goes low as shown at $t_{12}$ in FIG. 6A, causing pass transistor 207-1 to stop conducting to isolate the sense amplifier 206 (and data line 205-1 (D)) from ground. If not previously done, Row Y can be closed (as shown at $t_{13}$ in FIG. 6A) and the sense amplifier can be disabled (as shown at $t_{14}$ in FIG. 6A by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 6A).

FIG. 6A shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S1 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 6A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6B:
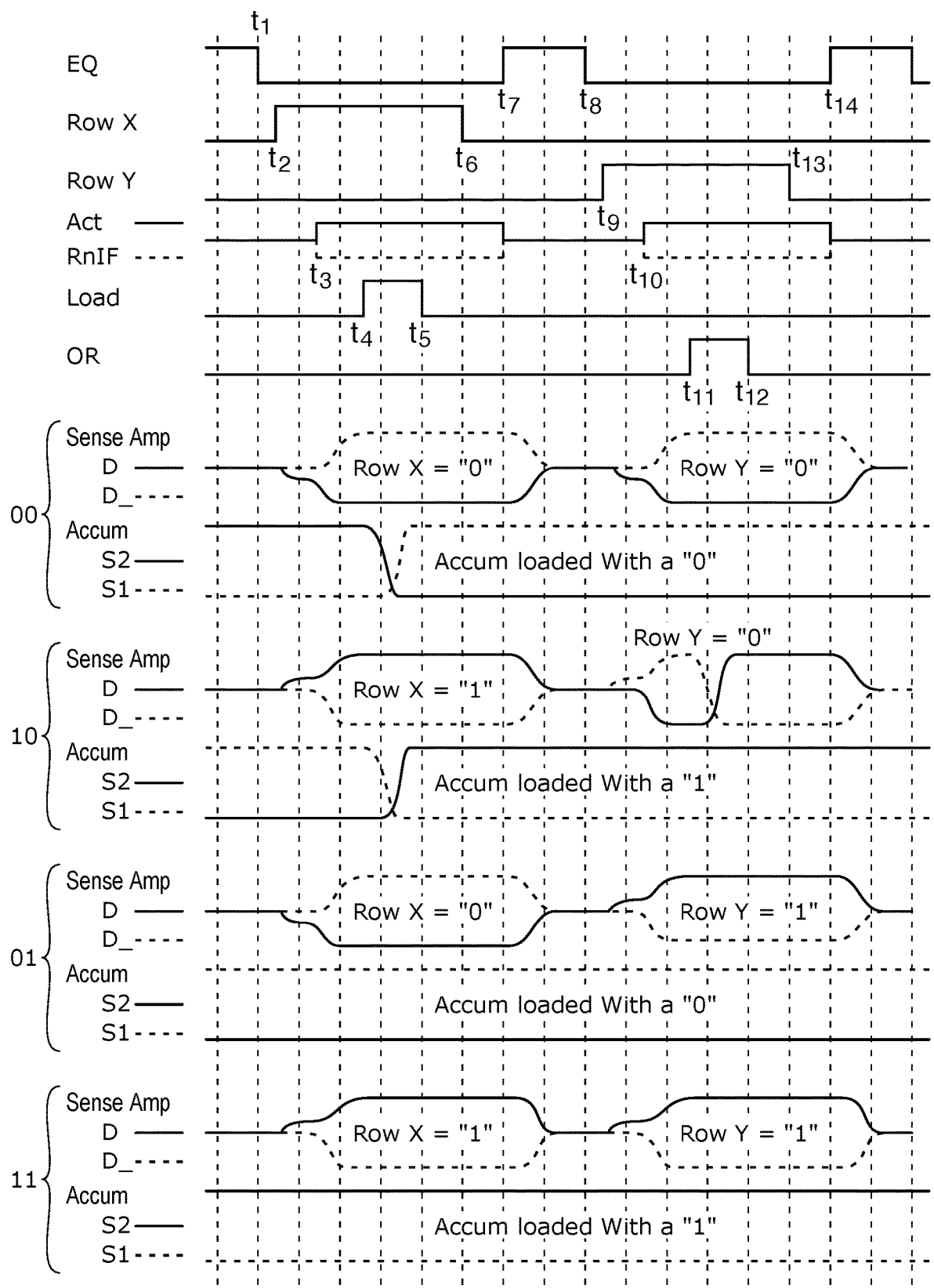

FIG. 6B illustrates a timing diagram associated with performing a number of logical operations using sensing circuitry in accordance with a number of embodiments of the present disclosure. FIG. 6B illustrates a timing diagram associated with initiating an OR logical operation after starting to load the second operand (e.g., Row Y data value) into the sense amplifier. FIG. 6B illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell 202-1 coupled to Row Y 204-Y). The operations to load the Row X data into the sense amplifier and accumulator that were previously described with respect to times $t_1$-$t_7$ shown in FIG. 6A are not repeated with respect to FIG. 6B. Example pseudo code associated with "ORing" the data values can include:

Deactivate EQ;
Open Row Y;
Fire Sense Amps (after which Row Y data resides in the sense amps);
Close Row Y;
When Row Y is closed, the sense amplifier still contains the Row Y data value.
Activate OR;
This results in the sense amplifier being written to the value of the function (e.g., Row X OR Row Y), which may overwrite the data value from Row Y previously stored in the sense amplifier as follows:
If the accumulator contains a "0" (i.e., a voltage corresponding to a "0" on node S2 and a voltage corresponding to a "1" on node S1), the sense amplifier data remains unchanged (Row Y data);
If the accumulator contains a "1" (i.e., a voltage corresponding to a "1" on node S2 and a voltage corresponding to a "0" on node S1), the sense amplifier data is written to a "1";
This operation leaves the data in the accumulator unchanged.
Deactivate OR;
Precharge;

The "Deactivate EQ" (shown at $t_8$ in FIG. 6B), "Open Row Y" (shown at $t_9$ in FIG. 6B), "Fire Sense Amps" (shown at $t_{10}$ in FIG. 6B), and "Close Row Y" (shown at $t_{13}$ in FIG. 6B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6B, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231 and the second data value (e.g., Row Y) stored in the sense amplifier 206, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206 as a result of the OR operation when the secondary latch of the accumulator contains a "1" regardless of the data value previously stored in the sense amp. This operation leaves the data in the accumulator unchanged. FIG. 6B shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 6B, causing pass transistor 207-2 to stop conducting to isolate the sense amplifier 206 (and data line D 205-2) from ground. If not previously done, Row Y can be closed (as shown at $t_{13}$ in FIG. 6B) and the sense amplifier can be disabled (as shown at $t_{14}$ in FIG. 4A by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6B.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-1 to conduct and activating the ANDinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or complement version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206. As previously mentioned, activating the ORinv control signal causes transistor 214-1 to conduct and activating the ANDinv control signal causes transistor 214-2 to conduct. The ORinv and/or ANDinv control signals are used in implementing the NOT function, as described further below:

Copy Row X into the Accumulator;
Deactivate EQ;
Open Row X;
Fire Sense Amps (after which Row X data resides in the sense amps);
Activate LOAD (sense amplifier data (Row X) is transferred to nodes S1 and S2 of the Accumulator and resides there dynamically;
Deactivate LOAD;
Activate ANDinv and ORinv (which puts the complement data value on the data lines);
This results in the data value in the sense amplifier being inverted (e.g., the sense amplifier latch is flipped);
This operation leaves the data in the accumulator unchanged;
Deactivate ANDinv and ORinv;
Close Row X;
Precharge;

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 206 and copied into the dynamic latch, a complement version of the data value in the dynamic latch of the accumulator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a complement data value (e.g., inverted data value) stored in the sense amp. That is, a true or complement version of the data value in the accumulator can be transferred to the sense amplifier by activating and deactivating ANDinv and ORinv. This operation leaves the data in the accumulator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the accumulator to reduce overall current utilized because the sense amps 206 are not at full rail voltages (e.g., supply voltage or ground/reference voltage) when accumulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized as follows:

Deactivate Norm and Activate Shift;
Deactivate EQ;
Open Row X;
Fire Sense Amps (after which shifted Row X data resides in the sense amps);
Activate Norm and Deactivate Shift;
Close Row X;
Precharge;

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

Activate Norm and Deactivate Shift;
Deactivate EQ;
Open Row X;
Fire Sense Amps (after which Row X data resides in the sense amps);
Deactivate Norm and Activate Shift;
Sense amplifier data (shifted left Row X) is transferred to Row X;
Close Row X;
Precharge;

In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Figure 7:
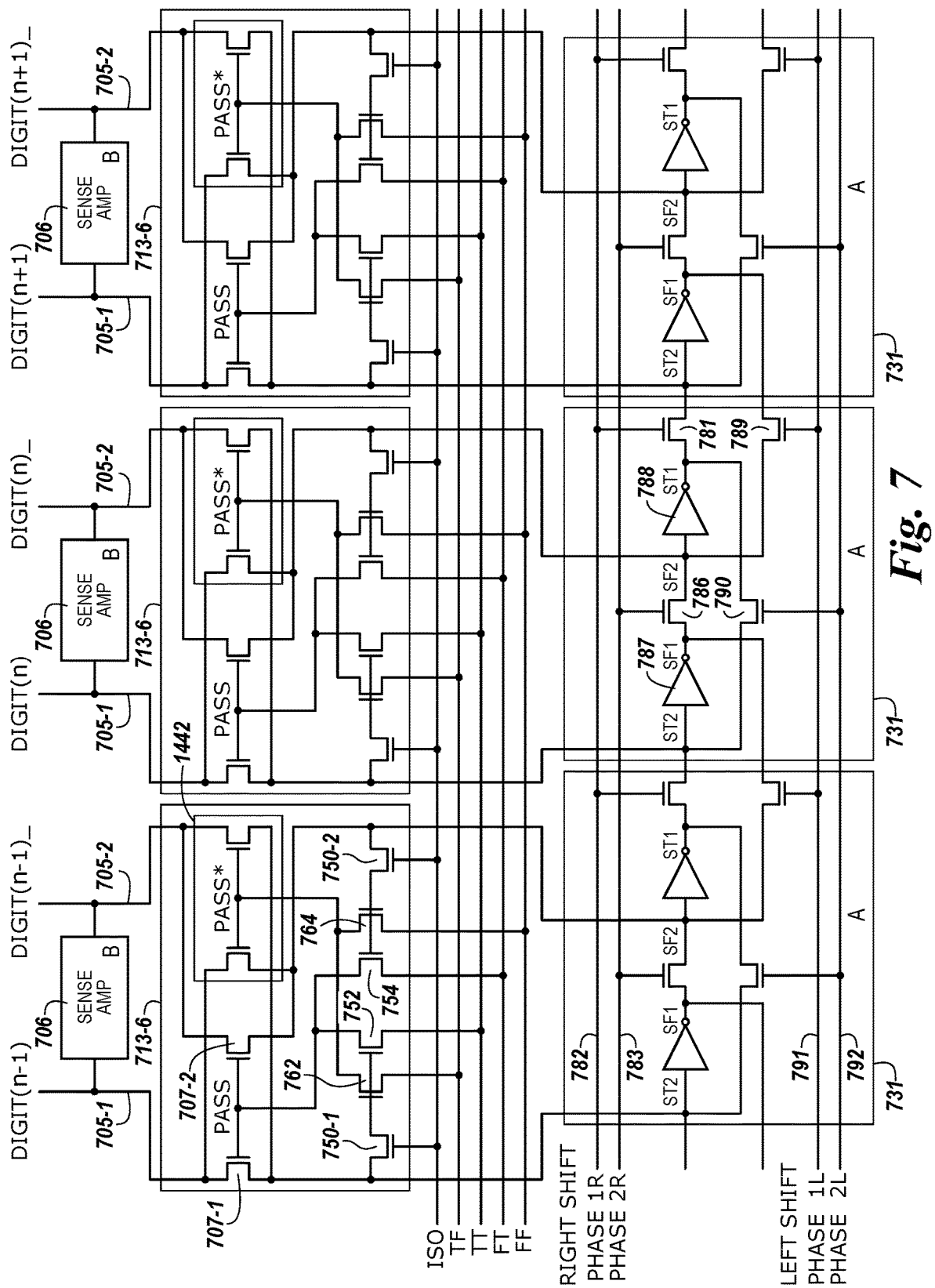
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a number of sense amplifiers 706 coupled to respective pairs of complementary sense lines 705-1 and 705-2, and a corresponding number of compute component 731 coupled to the sense amplifiers 706 via pass gates 707-1 and 707-2 (which can correspond to sense amplifiers 206, sense lines 205-1 and 205-2, compute components 231 coupled to sense amplifiers 206 via pass gates 207-1 and 207-2 in FIG. 2A). The gates of the pass gates 707-1 and 707-2 can be controlled by a logical operation selection logic signal, PASS. For example, an output of the logical operation selection logic 713-6 can be coupled to the gates of the pass gates 707-1 and 707-2.

According to the embodiment illustrated in FIG. 7, the compute components 731 can comprise respective stages (e.g., shift cells) of a loadable shift register configured to shift data values left and right. For example, as illustrated in FIG. 7, each compute component 731 (e.g., stage) of the shift register comprises a pair of right-shift transistors 781 and 786, a pair of left-shift transistors 789 and 790, and a pair of inverters 787 and 788. The signals PHASE 1R, PHASE 2R, PHASE 1L, and PHASE 2L can be applied to respective control lines 782, 783, 791 and 792 to enable/disable feedback on the latches of the corresponding compute components 731 in association with performing logical operations and/or shifting data in accordance with embodiments described herein. Examples of shifting data (e.g., from a particular compute component 731 to an adjacent compute component 731) is described further below with respect to FIGS. 9 and 10.

Figure 9:
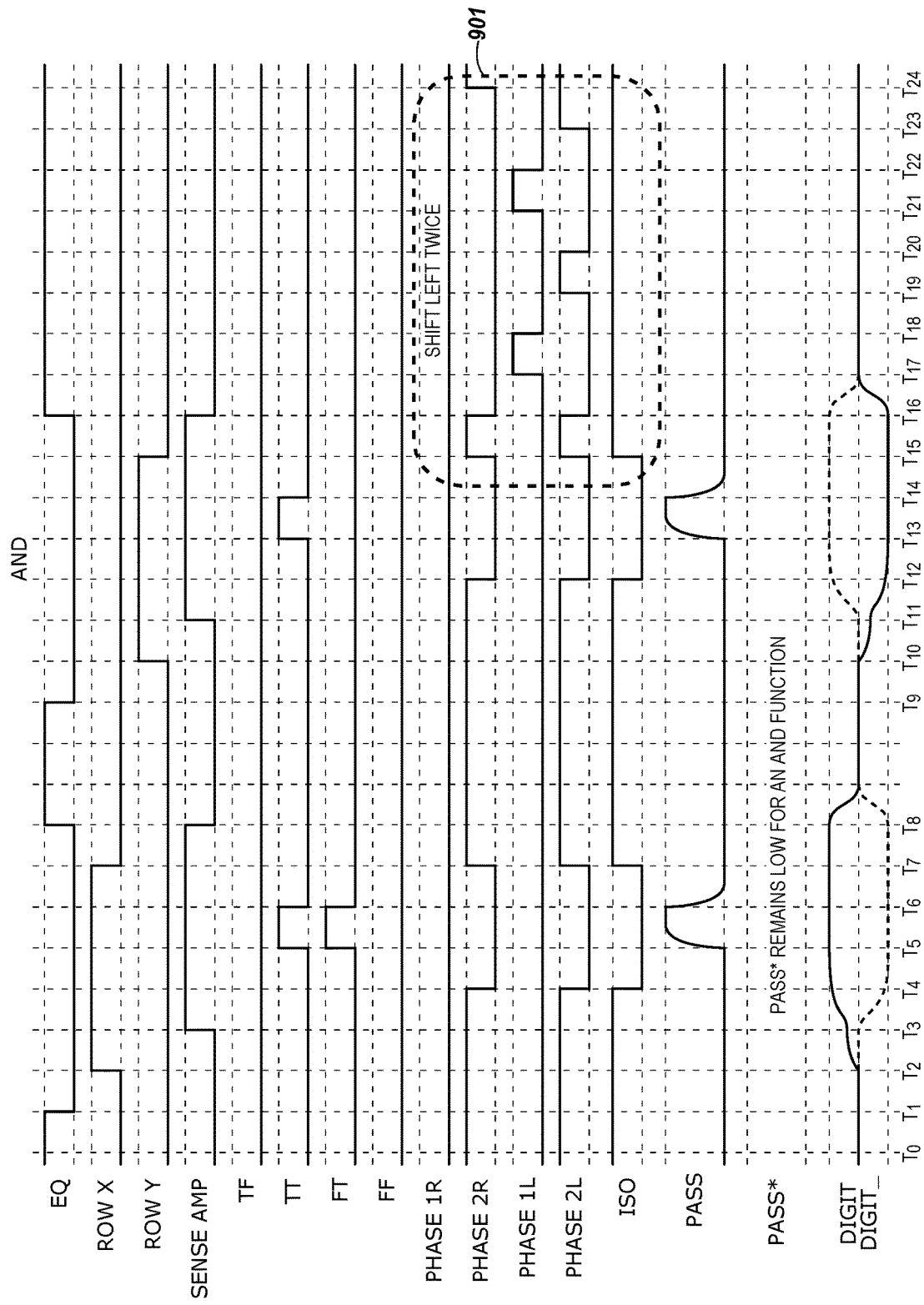
FIG. 9 illustrates a timing diagram associated with performing a logical operation and a shifting operation using the sensing circuitry in accordance with a number of embodiments of the present disclosure.
Figure 10:
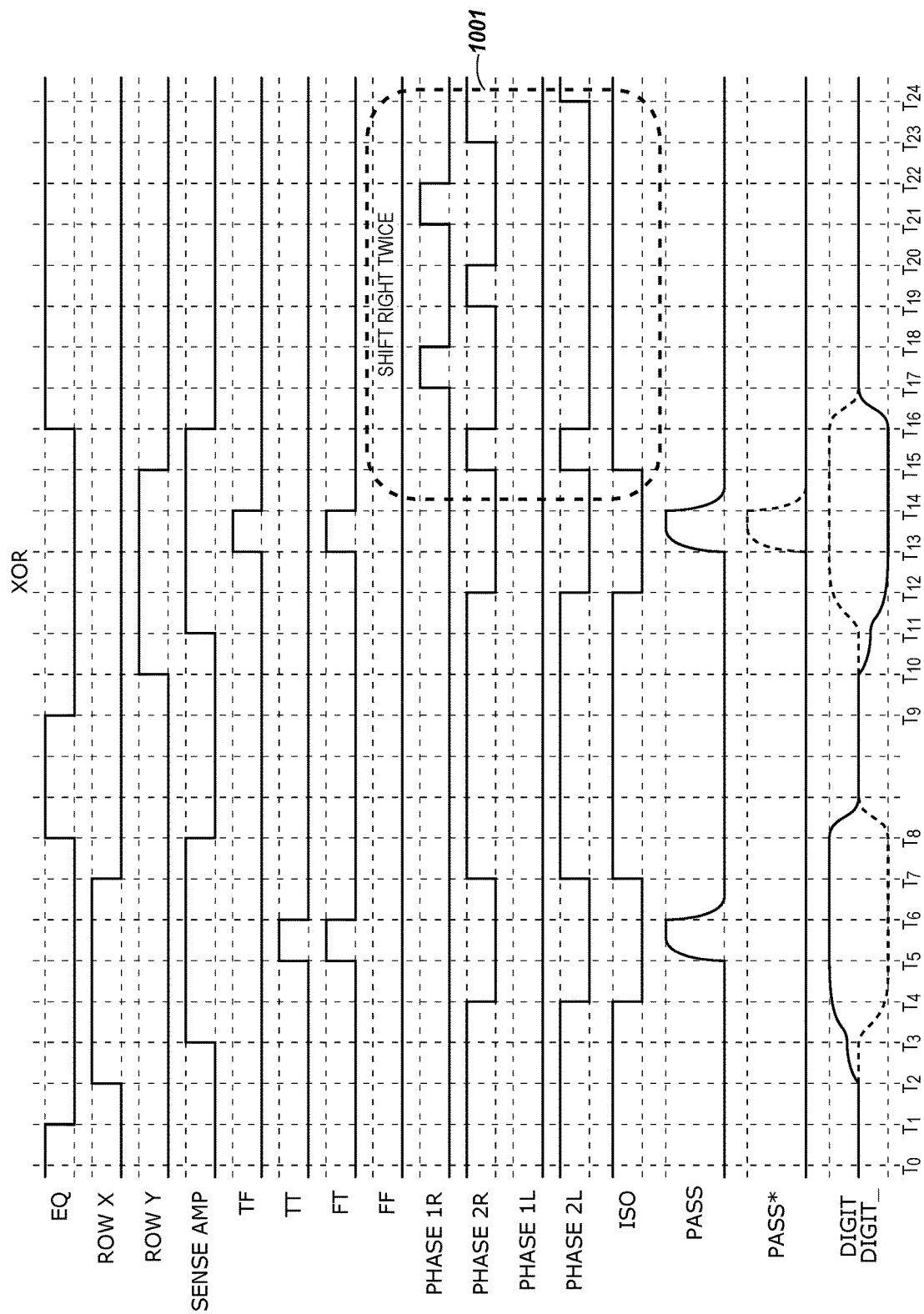
FIG. 10 illustrates a timing diagram associated with performing a logical operation and a shifting operation using the sensing circuitry in accordance with a number of embodiments of the present disclosure.

The logical operation selection logic 713-6 includes the swap gates 742, as well as logic to control the pass gates 707-1 and 707-2 and the swap gates 742. The logical operation selection logic 713-6 includes four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line through isolation transistor 750-1 (having a gate coupled to an ISO signal control line). Gates of logic selection transistors 764 and 754 are coupled to the complementary sense line through isolation transistor 750-2 (also having a gate coupled to an ISO signal control line). FIGS. 9 and 10 illustrate timing diagrams associated with performing logical operations and shifting operations using the sensing circuitry shown in FIG. 7.

FIG. 8 is a logic table illustrating selectable logic operation results implemented by a sensing circuitry (e.g., sensing circuitry 750 shown in FIG. 7) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 706 and compute component 731. The four control signals (e.g., TF, TT, FT, and FF), in conjunction with a particular data value present on the complementary sense lines (e.g., on nodes S and S*), controls the pass gates 707-1 and 707-2 and swap transistors 742, which in turn affects the data value in the compute component 731 and/or sense amplifier 706 before/after firing. The capability to selectably control the swap transistors 742 facilitates implementing logical operations involving inverse data values (e.g., inverse operands and/or inverse result), among others.

Similar to the logic tables illustrated in FIG. 10, Logic Table 8-1 illustrated in FIG. 8 shows the starting data value stored in the compute component 731 shown in column A at 844, and the starting data value stored in the sense amplifier 706 shown in column B at 845. The other 3 column headings in Logic Table 8-1 refer to the state of the pass gates 707-1 and 707-2 and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2 when the ISO control signal is asserted. The "NOT OPEN" column 856 corresponds to the pass gates 707-1 and 707-2 and the swap transistors 742 both being in a non-conducting condition, the "OPEN TRUE" column 870 corresponds to the pass gates 707-1 and 707-2 being in a conducting condition, and the "OPEN INVERT" column 871 corresponds to the swap transistors 742 being in a conducting condition. The configuration corresponding to the pass gates 707-1 and 707-2 and the swap transistors 742 both being in a conducting condition is not reflected in Logic Table 8-1 since this results in the sense lines being shorted together.

Via selective control of the pass gates 707-1 and 707-2 and the swap transistors 742, each of the three columns of the upper portion of Logic Table 8-1 can be combined with each of the three columns of the lower portion of Logic Table 8-1 to provide nine (e.g., 3×3) different result combinations, corresponding to nine different logical operations, as indicated by the various connecting paths shown at 875. The nine different selectable logical operations that can be implemented by the sensing circuitry 750 are summarized in Logic Table 8-2.

The columns of Logic Table 8-2 show a heading 880 that includes the states of logic selection control signals (e.g., FF, FT, TF, TT). For example, the state of a first logic selection control signal (e.g., FF) is provided in row 876, the state of a second logic selection control signal (e.g., FT) is provided in row 877, the state of a third logic selection control signal (e.g., TF) is provided in row 878, and the state of a fourth logic selection control signal (e.g., TT) is provided in row 879. The particular logical operation corresponding to the results is summarized in row 847.

FIG. 9 illustrates a timing diagram associated with performing a logical AND operation and a shifting operation using the sensing circuitry in accordance with a number of embodiments of the present disclosure. FIG. 9 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2). The ROW X and ROW Y signals correspond to signals applied to respective access line (e.g., access lines 204-X and 204-Y shown in FIG. 2) to access a selected cell (or row of cells). The SENSE AMP signal corresponds to a signal used to enable/disable a sense amplifier (e.g., sense amplifier 706). The TF, TT, FT, and FF signals correspond to logic selection control signals such as those shown in FIG. 7 (e.g., signals coupled to logic selection transistors 762, 752, 754, and 764). The PHASE 1R, PHASE 2R, PHASE 1L, and PHASE 2L signals correspond to the control signals (e.g., clock signals) provided to respective control lines 782, 783, 791 and 792 shown in FIG. 7. The ISO signal corresponds to the signal coupled to the gates of the isolation transistors 750-1 and 750-2 shown in FIG. 7. The PASS signal corresponds to the signal coupled to the gates of pass transistors 707-1 and 707-2 shown in FIG. 7, and the PASS* signal corresponds to the signal coupled to the gates of the swap transistors 742. The DIGIT and DIGIT_ signals correspond to the signals present on the respective sense lines 705-1 (e.g., DIGIT (n)) and 705-2 (e.g., DIGIT (n)_).

The timing diagram shown in FIG. 9 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 9, reference will be made to the sensing circuitry described in FIG. 7. For example, the logical operation described in FIG. 9 can include storing the data value of the ROW X memory cell (e.g., the "ROW X data value) in the latch of the corresponding compute component 731 (e.g., the "A" data value), which can be referred to as the accumulator 731, storing the data value of the ROW Y memory cell (e.g., the "ROW Y data value") in the latch of the corresponding sense amplifier 706 (e.g., the "B" data value), and performing a selected logical operation (e.g., a logical AND operation in this example) on the ROW X data value and the ROW Y data value, with the result of the selected logical operation being stored in the latch of the compute component 731.

As shown in FIG. 9, at time $T_1$, equilibration of the sense amplifier 706 is disabled (e.g., EQ goes low). At time $T_2$, ROW X goes high to access (e.g., select) the ROW X memory cell. At time $T_3$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW X data value (e.g., as shown by the DIGIT and DIGIT_ signals), and the ROW X data value is latched in the sense amplifier 706. At time $T_4$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time $T_4$, ISO goes low, which disables isolation transistors 750-1 and 750-2. At time $T_5$, TT and FT are enabled (e.g., go high), which results in PASS going high (e.g., since either transistor 752 or 754 will conduct depending on which of node ST2 or node SF2 was high when ISO was disabled at time $T_4$ (recall that when ISO is disabled, the voltages of the nodes ST2 and SF2 reside dynamically on the gates of the respective enable transistors 752 and 754). PASS going high enables the pass transistors 707-1 and 707-2 such that the DIGIT and DIGIT_signals, which correspond to the ROW X data value, are provided to the respective compute component nodes ST2 and SF2. At time $T_6$, TT and FT are disabled, which results in PASS going low, which disables the pass transistors 707-1 and 707-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 731 such that the ROW X data value is latched therein. Enabling ISO at time $T_7$ again couples nodes ST2 and SF2 to the gates of the enable transistors 752, 754, 762, and 764. At time $T_8$, equilibration is enabled (e.g., EQ goes high such that DIGIT and DIGIT_ are driven to an equilibrate voltage such as $V_{DD}/2$) and the sense amplifier 706 is disabled (e.g., SENSE AMP goes low).

With the ROW X data value latched in the compute component 731, equilibration is disabled (e.g., EQ goes low at time $T_9$). At time $T_{10}$, ROW Y goes high to access (e.g., select) the ROW Y memory cell. At time $T_{11}$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW Y data value (e.g., as shown by the DIGIT and DIGIT_signals), and the ROW Y data value is latched in the sense amplifier 706. At time $T_{12}$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time $T_{12}$, ISO goes low, which disables isolation transistors 750-1 and 750-2. Since the desired logical operation in this example is an AND operation, at time $T_{13}$, TT is enabled while TF, FT and FF remain disabled (as shown in TABLE 8-2, FF=0, FT=0, TF=0, and TT=1 corresponds to a logical AND operation). Whether enabling TT results in PASS going high depends on the value stored in the compute component 731 when ISO is disabled at time $T_{12}$. For example, enable transistor 752 will conduct if node ST2 was high when ISO is disabled, and enable transistor will not conduct if node ST2 was low when ISO was disabled at time $T_{12}$.

In this example, if PASS goes high at time $T_{13}$, the pass transistors 707-1 and 707-2 are enabled such that the DIGIT and DIGIT_ signals, which correspond to the ROW Y data value, are provided to the respective compute component nodes ST2 and SF2. As such, the value stored in the compute component 731 (e.g., the ROW X data value) may be flipped, depending on the value of DIGIT and DIGIT_ (e.g., the ROW Y data value). In this example, if PASS stays low at time $T_{13}$, the pass transistors 707-1 and 707-2 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same.

At time $T_{14}$, TT is disabled, which results in PASS going (or remaining) low, such that the pass transistors 707-1 and 707-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 731 such that the result of the AND operation (e.g., "A" AND "B") is latched therein. Enabling ISO at time $T_{15}$ again couples nodes ST2 and SF2 to the gates of the enable transistors 752, 754, 762, and 764. At time $T_{16}$, equilibration is enabled (e.g., EQ goes high such that DIGIT and DIGIT_ are driven to an equilibrate voltage) and the sense amplifier 706 is disabled (e.g., SENSE AMP goes low).

The result of the AND operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 9 also includes (e.g., at 901) signaling associated with shifting data (e.g., from a compute component 731 to an adjacent compute component 731). The example shown in FIG. 9 illustrates two left shifts such that a data value stored in a compute component corresponding to column "N" is shifted left to a compute component corresponding to column "N–2". As shown at time $T_{16}$, PHASE 2R and PHASE 2L are disabled, which disables feedback on the compute component latches, as described above. To perform a first left shift, PHASE 1L is enabled at time $T_{17}$ and disabled at time $T_{18}$. Enabling PHASE 1L causes transistor 789 to conduct, which causes the data value at node SF1 to move left to node SF2 of a left-adjacent compute component 731. PHASE 2L is subsequently enabled at time $T_{19}$ and disabled at time $T_{20}$. Enabling PHASE 2L causes transistor 790 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

FIG. 10 illustrates a timing diagram associated with performing a logical XOR operation and a shifting operation using the sensing circuitry in accordance with a number of embodiments of the present disclosure. FIG. 10 includes the same waveforms described in FIG. 9 above. However, the timing diagram shown in FIG. 10 is associated with performing a logical XOR operation on a ROW X data value and a ROW Y data value (e.g., as opposed to a logical AND operation). Reference will again be made to the sensing circuitry described in FIG. 7.

The signaling indicated at times $T_0$ through $T_9$ for FIG. 10 are the same as for FIG. 9 and will not be repeated here. As such, at time T9, EQ is disabled with the ROW X data value being latched in the compute component 731. At time $T_{10}$, ROW Y goes high to access (e.g., select) the ROW Y memory cell. At time $T_{11}$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW Y data value (e.g., as shown by the DIGIT and DIGIT_ signals), and the ROW Y data value is latched in the sense amplifier 706. At time $T_{12}$, the PHASE 2R and PHASE 2L signals go low, which disables feedback on the latch of the compute component 731 (e.g., by turning off transistors 786 and 790, respectively) such that the value stored in the compute component 731 may be overwritten during the logical operation. Also, at time $T_{12}$, ISO goes low, which disables isolation transistors 750-1 and 750-2. Since the desired logical operation in this example is an XOR operation, at time $T_{13}$, TF and FT are enabled while TT and FF remain disabled (as shown in TABLE 8-2, FF=0, FT=1, TF=1, and TT=0 corresponds to a logical XOR (e.g., "AXB") operation). Whether enabling TF and FT results in PASS or PASS* going high depends on the value stored in the compute component 731 when ISO is disabled at time $T_{12}$. For example, enable transistor 762 will conduct if node ST2 was high when ISO is disabled, and enable transistor 762 will not conduct if node ST2 was low when ISO was disabled at time $T_{12}$. Similarly, enable transistor 754 will conduct if node SF2 was high when ISO is disabled, and enable transistor 754 will not conduct if node SF2 was low when ISO is disabled.

In this example, if PASS goes high at time $T_{13}$, the pass transistors 707-1 and 707-2 are enabled such that the DIGIT and DIGIT_ signals, which correspond to the ROW Y data value, are provided to the respective compute component nodes ST2 and SF2. As such, the value stored in the compute component 731 (e.g., the ROW X data value) may be flipped, depending on the value of DIGIT and DIGIT_ (e.g., the ROW Y data value). In this example, if PASS stays low at time $T_{13}$, the pass transistors 707-1 and 707-2 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same. In this example, if PASS* goes high at time $T_{13}$, the swap transistors 742 are enabled such that the DIGIT and DIGIT_ signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_ would be provided to node ST2). As such, the value stored in the compute component 731 (e.g., the ROW X data value) may be flipped, depending on the value of DIGIT and DIGIT_ (e.g., the ROW Y data value). In this example, if PASS* stays low at time $T_{13}$, the swap transistors 742 are not enabled such that the DIGIT and DIGIT_ signals, which correspond to the ROW Y data value, remain isolated from the nodes ST2 and SF2 of the compute component 731. As such, the data value in the compute component (e.g., the ROW X data value) would remain the same.

At time $T_{14}$, TF and FT are disabled, which results in PASS and PASS* going (or remaining) low, such that the pass transistors 707-1 and 707-2 and swap transistors 742 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 731 such that the result of the XOR operation (e.g., "A" XOR "B") is latched therein. Enabling ISO at time $T_{15}$ again couples nodes ST2 and SF2 to the gates of the enable transistors 752, 754, 762, and 764. At time $T_{16}$, equilibration is enabled (e.g., EQ goes high such that DIGIT and DIGIT_ are driven to an equilibrate voltage) and the sense amplifier 706 is disabled (e.g., SENSE AMP goes low).

The result of the XOR operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 10 also includes (e.g., at 1001) signaling associated with shifting data (e.g., from a compute component 731 to an adjacent compute component 731). The example shown in FIG. 10 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 781 to conduct, which causes the data value at node ST1 to move right to node ST2 of a right-adjacent compute component 731. PHASE 2R is subsequently enabled at time $T_{19}$ and disabled at time $T_{20}$. Enabling PHASE 2R causes transistor 786 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 9 and 10 include the logical operation result being stored in the compute component (e.g., 731), sensing circuitry in accordance with embodiments described herein can be operated to perform logical operations with the result being initially stored in the sense amplifier (e.g., as illustrated in FIG. 8). Also, embodiments are not limited to the "AND" and "XOR" logical operation examples described in FIGS. 9 and 10, respectively. For example, sensing circuitry in accordance with embodiments of the present disclosure (e.g., 750 shown in FIG. 7) can be controlled to perform various other logical operations such as those shown in Table 8-2.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred there between. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   determining, using sensing circuitry coupled to a memory array and controlled by a controller, a length of a longest element of a plurality of variable length elements of a vector stored in the memory array by:
   performing, in the sensing circuitry, a shift operation on an element mask vector indicating most significant bits of the plurality of variable length elements of the vector.

2. The method of claim 1, wherein determining the length of the longest element comprises an AND operation and the shift operation, wherein the AND operation and the shift operation are based on the length of the longest element.

3. The method of claim 2, wherein the AND operation and the shift operation are each performed using the sensing circuitry coupled to each of a number of columns of complementary sense lines.

4. The method of claim 1, wherein the determining of the length of the longest element comprises determining whether one or more of bits of each of the plurality of variable length elements includes a particular value.

5. The method of claim 4, wherein the particular value includes a bit value of 1.

6. The method of claim 1, wherein the vector is stored in a group of memory cells coupled to a particular access line.

7. The method of claim 6, wherein a result of the determination of the length of the longest element is stored in a group of memory cells coupled to a different particular access line of the memory array.

8. The method of claim 1, further comprising performing an invert operation on the element mask vector and performing a different shift operation on the result of the invert operation to create a static mask.

9. The method of claim 8, wherein the static mask indicates a left-most boundary to begin performing an AND operation and the shift operation.

10. An apparatus comprising:
a group of memory cells, coupled to an access line of a memory array and a plurality sense lines, and configured to store a plurality of variable length elements; and
a controller configured to cause sensing circuitry coupled to the plurality of sense lines to:
perform, in the sensing circuitry, a shift operation on a bit vector indicating most significant bits of the plurality of variable length elements of the vector to determine a length of the longest element; and
concurrently performing an operation with a determination of the length of the longest element, wherein the operation is performed using at least one of the plurality of variable length elements.

11. The apparatus of claim 10, wherein the controller is configured to cause the sensing circuitry to determine a most significant bit of each of the plurality of variable length elements.

12. The apparatus of claim 11, wherein the controller is configured to cause a storing of elements representing the most significant bit of each of the plurality of variable length elements as the element mask vector.

13. The apparatus of claim 12, wherein the controller is configured to cause the sensing circuitry to perform an invert operation on the element mask vector.

14. The apparatus of claim 13, wherein the controller is configured to cause the sensing circuitry to perform the different shift operation on the inverted element mask vector.

15. The apparatus of claim 14, wherein the different shift operation is a left shift operation and a result of the shift operation is stored as a static mask in a group of cells coupled to a particular access line of the array.

16. The apparatus of claim 10, wherein the controller is further to perform a loop operation on the plurality of variable length elements by:
determining whether one or more bits of the element mask vector indicating the most significant bit of each of the plurality of variable length elements include a particular value; and
in response to one or more bits including the particular value:
performing the shift operation on the element mask vector; and
performing an AND operation with the shifted element mask vector and a static mask vector indicating a most significant bit of each of the plurality of variable length elements.

17. The apparatus of claim 16, wherein the controller is configured to cause the sensing circuitry to repeat the loop operation by:
determining whether one or more bits of a previously shifted mask includes a particular value;
performing an additional shift operation on the previously shifted mask; and
performing an additional AND operation with the previously shifted mask and the static mask vector.

18. A method, comprising:
receiving, from a host, an element mask vector indicating a most significant bit for each element of a plurality of variable length elements;
determining, using a controller to control sensing circuitry, a length of a longest element of the plurality of variable length elements of a vector by:
performing, in the sensing circuitry, a shift operation on the element mask vector to determine the length of the longest element of the plurality of variable length elements; and
providing the length of the longest element to the host.

19. The method of claim 18, wherein the method further comprises:
determining a static mask vector by:
inverting the element mask vector; and
shifting the inverted elements.

20. The method of claim 19, wherein the method further comprises
ANDing the shifted element mask vector with the static mask vector;
determining, subsequent to the ANDing operation, whether at least one bit of the elements is a particular value; and
in response to at least one bit of the elements being a particular value, repeating the shift operation and the AND operation on the elements.

* * * * *